(12) United States Patent
Buckler et al.

(10) Patent No.: US 12,288,341 B2
(45) Date of Patent: Apr. 29, 2025

(54) SYSTEM AND METHODS FOR PROCESSING SPATIAL DATA

(71) Applicant: Cornell University, Ithaca, NY (US)

(72) Inventors: Mark Buckler, Ithaca, NY (US); Adrian Sampson, Ithaca, NY (US)

(73) Assignee: Cornell University, Ithaca, NY (US)

( * ) Notice: Subject to any disclaimer, the term of this patent is extended or adjusted under 35 U.S.C. 154(b) by 950 days.

(21) Appl. No.: 17/021,923

(22) Filed: Sep. 15, 2020

(65) Prior Publication Data

US 2020/0410352 A1 Dec. 31, 2020

Related U.S. Application Data

(63) Continuation of application No. PCT/US2018/029402, filed on Apr. 25, 2018, and a
(Continued)

(51) Int. Cl.
| | |
|---|---|
| G06F 9/50 | (2006.01) |
| G06F 18/21 | (2023.01) |
| G06N 3/063 | (2023.01) |
| G06N 3/08 | (2023.01) |
| G06T 7/20 | (2017.01) |
| H03M 7/30 | (2006.01) |
| H03M 7/46 | (2006.01) |

(52) U.S. Cl.
CPC ............. *G06T 7/20* (2013.01); *G06F 9/5027* (2013.01); *G06F 18/2163* (2023.01); *G06N 3/063* (2013.01); *G06N 3/08* (2013.01); *H03M 7/46* (2013.01); *H03M 7/6005* (2013.01); *H03M 7/6011* (2013.01)

(58) Field of Classification Search
CPC ...... G06N 3/08; G06N 3/063; G06F 18/2163; G06F 9/5027; H03M 7/46; H03M 7/6005; H03M 7/6011
See application file for complete search history.

(56) References Cited

U.S. PATENT DOCUMENTS 5,822,742 A * 10/1998 Alkon ...................... G06N 3/04
706/31
9,813,616 B2 * 11/2017 Lelescu ................... G06T 11/60
(Continued)

OTHER PUBLICATIONS

Ayinde et al., "Nonredundant sparse feature extraction using autoencoders with receptive fields clustering", 2017 (Year: 2017).*
(Continued)

*Primary Examiner* — George Giroux
(74) *Attorney, Agent, or Firm* — Ryan, Mason & Lewis, LLP

(57) ABSTRACT

A system for processing spatial data may be designed to receive neural network outputs corresponding to a first spatial data set, and translate the neural network outputs corresponding to the first spatial data set based on the motion between a second spatial data set and the first spatial data set. The system may perform zero-gap run length encoding on the neural network outputs to store the neural network outputs in memory. The system may also perform on-the-fly skip zero decoding and bilinear interpolation to translate the neural network outputs.

21 Claims, 20 Drawing Sheets

Related U.S. Application Data continuation of application No. PCT/US2018/029404, filed on Apr. 25, 2018, and a continuation of application No. PCT/US2018/029407, filed on Apr. 25, 2018.

(60) Provisional application No. 62/644,147, filed on Mar. 16, 2018.

(56) References Cited

U.S. PATENT DOCUMENTS

| | | | | |
|---|---|---|---|---|
| 10,305,604 | B1* | 5/2019 | Kudinov | G06T 7/74 |
| 10,701,394 | B1* | 6/2020 | Caballero | G06N 3/045 |
| 2017/0094311 | A1* | 3/2017 | Chou | H04N 19/53 |
| 2018/0063540 | A1* | 3/2018 | Zhu | H04N 19/54 |
| 2018/0225550 | A1* | 8/2018 | Jacobsen | G06N 3/04 |
| 2018/0253837 | A1* | 9/2018 | Ghesu | G06T 7/0012 |
| 2018/0285678 | A1* | 10/2018 | Baum | G06F 30/27 |
| 2019/0075301 | A1* | 3/2019 | Chou | H04N 19/132 |

OTHER PUBLICATIONS

Gu et al., "Enlarging Effective Receptive Field of Convolutional Neural Networks for Better Semantic Segmentation", 2017 (Year: 2017).*

Wang et al., "Large Receptive Field Convolutional Neural Network for Image Super-Resolution", 2017 (Year: 2017).*

Guo et al. (A review of semantic segmentation using deep neural networks, Oct. 2017, pp. 87-93) (Year: 2017).*

International Search Report and Written Opinion issued Oct. 12, 2018 in PCT Application No. PCT/US2018/029402.

International Search Report and Written Opinion issued Oct. 12, 2018 in PCT Application No. PCT/US2018/029404.

International Search Report and Written Opinion issued Oct. 12, 2018 in PCT Application No. PCT/US2018/029407.

Bors, Adrian G., and Ioannis Pitas. "Median radial basis function neural network." IEEE transactions on Neural Networks 7, No. 6 (1996): 1351-1364.

Buckler, Mark, Philip Bedoukian, Suren Jayasuriya, and Adrian Sampson. "EVA2: Exploiting Temporal Redundancy in Live Computer Vision." In 2018 ACM/IEEE 45th Annual International Symposium on Computer Architecture (ISCA), pp. 533-546. IEEE, 2018.

Erdeljan, Andrea, Bogdan Vukobratovic, and Rastislav Struharik. "IP core for efficient zero-run length compression of CNN feature maps." In 2017 25th Telecommunication Forum (TELFOR), pp. 1-4. IEEE, 2017.

Fischer, Philipp, Alexey Dosovitskiy, Eddy Ilg, Philip Hausser, Caner Hazrba, Vladimir Golkov, Patrick Van der Smagt, Daniel Cremers, and Thomas Brox. "Flownet: Learning optical flow with convolutional networks." arXiv preprint arXiv:1504.06852 (2015).

Tg, Eddy, Nikolaus Mayer, Tonmoy Saikia, Margret Keuper, Alexey Dosovitskiy, and Thomas Brox. "Flownet 2.0: Evolution of optical flow estimation with deep networks." In Proceedings of the IEEE conference on computer vision and pattern recognition, pp. 2462-2470. 2017.

Jain, Samvit, and Joseph E. Gonzalez. "Fast semantic segmentation on video using block motion-based feature interpolation." In Proceedings of the European Conference on Computer Vision (ECCV), pp. 0-0. 2018.

Zhu, Xizhou, Yuwen Xiong, Jifeng Dai, Lu Yuan, and Yichen Wei. "Deep feature flow for video recognition." In Proceedings of the IEEE conference on computer vision and pattern recognition, pp. 2349-2358. 2017.

Zhu, Xizhou, Yujie Wang, Jifeng Dai, Lu Yuan, and Yichen Wei. "Flow-guided feature aggregation for video object detection." In Proceedings of the IEEE International Conference on Computer Vision, pp. 408-417. 2017.

\* cited by examiner

|   | 1 | 2 | 3 | 4 | 5 | 6 |
|---|---|---|---|---|---|---|
| 6 | (1,6) | (2,6) | (3,6) | (4,6) | (5,6) | (6,6) |
| 5 | (1,5) | (2,5) | (3,5) | (4,5) | (5,5) | (6,5) |
| 4 | (1,4) | (2,4) | (3,4) | (4,4) | (5,4) | (6,4) |
| 3 | (1,3) | (2,3) | (3,3) | (4,3) | (5,3) | (6,3) |
| 2 | (1,2) | (2,2) | (3,2) | (4,2) | (5,2) | (6,2) |
| 1 | (1,1) | (2,1) | (3,1) | (4,1) | (5,1) | (6,1) |

SYSTEM AND METHODS FOR PROCESSING SPATIAL DATA

CROSS REFERENCE TO RELATED APPLICATIONS

This application is a continuation of International Application Nos. PCT/US2018/029407, PCT/US2018/029404, and PCT/US2018/029402, all filed on Apr. 25, 2018, and all claiming the benefit of, and priority to, U.S. Provisional Application No. 62/644,147, entitled "Activation Motion Compensation", filed on Mar. 16, 2018. The entire contents of all of these listed applications are hereby incorporated by reference for all purposes.

BACKGROUND

Computer vision relates to designing computers to perform automated tasks such as extracting, processing, analyzing and understanding information from digital images. Common computer vision tasks include object recognition, detection, character recognition, facial recognition, position estimation, and other related tasks that may require deep machine learning. Convolutional neural networks (CNNs) are feed-forward artificial neural networks that can enable deep machine learning and can be implemented within devices to facilitate the performance of computer vision tasks. CNNs typically consist of an input layer, an output layer and multiple hidden layers. The hidden layers usually consist of convolutional layers, pooling layers and fully connected layers. Generic CNNs process images using every one of its layers to extract and classify data, which can require relatively high processing power.

SUMMARY

At least one aspect of the disclosure is directed towards a system for processing spatial data. The system includes a memory unit configured to receive and store a first spatial data set and a second spatial data set. The system further includes at least one processor. The at least one processor is collectively configured to divide the first spatial data set into a first plurality of receptive fields and divide the second spatial data set into a second plurality of receptive fields. The at least one processor is further collectively configured to store each neural network output in the memory unit. The at least one processor is further collectively configured to identify, for each receptive field in the second plurality of receptive fields, a prior location in the first spatial data set, wherein the prior location is between multiple receptive field locations in the first spatial data set. The at least one processor is further collectively configured to receive, from the memory unit, the neural network outputs corresponding to the receptive fields of the first spatial data set proximate to the identified prior location for each receptive field in the second plurality of receptive fields. The at least one processor is further collectively configured to calculate a plurality of predicted neural network outputs for the second plurality of receptive fields by interpolating between the neural network outputs corresponding to the receptive fields proximate to the prior locations in the first spatial data set.

Interpolating between the neural network outputs may include configuring the at least one processor to perform bilinear interpolation.

The at least one processor may include an AI accelerator. The AI accelerator may be configured to perform zero-gap run length encoding on the first plurality of neural network outputs and store the run-length encoded first plurality of neural network outputs in the memory unit.

The at least one processor may include an interpolation processing unit configured to calculate the plurality of predicted neural network outputs, wherein calculating the plurality of predicted neural network outputs includes performing on-the-fly skip-zero decoding on the zero-gap run-length encoded first plurality of neural network outputs. The interpolation processing unit may be further configured to perform on-the-fly skip-zero decoding for a given receptive field in the second spatial data set by storing the neural network outputs obtained from memory for the receptive fields proximate the identified prior location of the given receptive field in a plurality of decoding lanes, wherein each decoding lane stores the zero-gap run-length encoded neural network outputs for a plurality of channels associated with a different receptive field of the first spatial data set located proximate the identified prior location of the given receptive field of the second spatial data set.

The at least one processor may include an artificial intelligence processor. The artificial intelligence processor may include a convolutional neural network portion. The artificial intelligence processor may be configured to process the first plurality of receptive fields to obtain a first plurality of neural network outputs, wherein each neural network output corresponds to a receptive field in the first plurality of receptive fields.

Another aspect is directed towards a method for processing spatial data. The method includes receiving a first spatial data set, dividing the first spatial data set into a first plurality of receptive fields, and processing, by a neural network portion, the first plurality of receptive fields to obtain a first plurality of neural network outputs, wherein each neural network output corresponds to a receptive field in the first plurality of receptive fields. The method further includes storing the first plurality of neural network outputs in memory. The method further includes receiving a second spatial data set, dividing the second spatial data set into a second plurality of receptive fields, and identifying for each receptive field in the second plurality of receptive fields a prior location in the first spatial data set, wherein the prior location is between multiple receptive field locations in the first plurality of receptive fields. The method further includes calculating a plurality of predicted neural network outputs for each of the second plurality of receptive fields by, for a given receptive field in the second plurality of receptive fields, interpolating between the neural network outputs corresponding to the receptive fields proximate to the prior location of the given receptive field in the first spatial data set.

The neural network portion can be a convolutional neural network portion. Storing the first plurality of neural network outputs may include run-length encoding the first plurality of neural network outputs. Interpolating between the neural network outputs may include performing bilinear interpolation.

Calculating a plurality of predicted neural network outputs may include performing on-the-fly skip-zero decoding. Performing on-the-fly skip-zero decoding for a given receptive field in the second spatial data set may include storing the neural network outputs obtained from memory for the receptive fields proximate the identified prior location of the given receptive field in a plurality of decoding lanes, wherein each decoding lane stores zero-gap run-length encoded neural network outputs for a plurality of channels associated with a different receptive field of the first spatial data set located proximate the identified prior location of the given receptive field of the second spatial data set.

Another aspect of the disclosure is directed towards a system for estimating motion between image frames. The system includes at least one memory unit configured to receive and store a first input frame and a second input frame. The system further includes at least one processor. The at least one processor is collectively configured to divide the second input frame into a plurality of overlapping receptive fields, wherein adjacent receptive fields of the plurality of receptive fields are offset from one another by a stride value S, and each receptive field in the plurality of receptive fields includes a block of pixels having at least 2S pixels in a first dimension and at least 2S pixels in a second orthogonal dimension, forming an at least 2S-by-at-least-2S block of pixels. The at least one processor is further collectively configured to estimate the motion of the pixel block of each receptive field in the plurality of receptive fields relative to a corresponding prior location in the first input frame.

Estimating the motion of each pixel block of the receptive fields in the plurality of receptive fields relative to a corresponding prior location in the first input frame may include calculating absolute pixel difference sums for each pixel block in the plurality of receptive fields. Estimating the motion of the pixel block of each receptive field may further include computing a vector field representing the motion of each pixel block in each receptive field in the plurality of receptive fields relative to a corresponding prior location in the first input frame. At least one receptive field may include a zero-padded portion.

The pixels in each receptive field of the second input frame may be further grouped into S×S pixel tiles. Estimating the motion of the pixel block of each receptive field in the plurality of receptive fields relative to a prior location in the first input frame can include computing a difference of each S×S pixel tile in the plurality of receptive fields relative to a number of potential prior locations of each S×S pixel tile in the first input frame, wherein the number of potential prior locations is greater than 1. Estimating the motion of the pixel block in each receptive field in the plurality of receptive fields may also include, selecting a first receptive field in the plurality of receptive fields, computing a tile difference for each S×S pixel tile in the first receptive field relative to a number of potential prior locations for each S×S pixel tile in the first input frame, wherein the number of potential prior locations for each S×S pixel tile in the first input frame is greater than 1 and is based on a search radius, and summing the tile differences of each S×S pixel tile in the first receptive field for each of the number of potential prior locations of each S×S pixel tile of the first receptive field in the first input frame to obtain a plurality of receptive field differences. Computing a tile difference may include computing an L-1 normalized difference of the S×S pixel tile.

Estimating the motion for the pixel block of each receptive field in the plurality of receptive fields may also include, for the first receptive field, selecting one of the potential prior locations by identifying the potential prior location having a minimum receptive field difference relative to a remainder of potential prior locations of the first receptive field in the first input frame.

Estimating the motion of the pixel block in each receptive field in the plurality of receptive fields may include selecting a second receptive field in the plurality of receptive fields, wherein the second receptive field has a plurality of potential prior locations in the first input frame. Estimating the motion of the pixel block in the second receptive field may include obtaining a previously computed receptive field difference for a location in the first input frame adjacent to the potential location, the adjacent location including shared tile differences of the previously computed receptive field difference with respect to the potential location and unshared tile differences of the previously computed receptive field difference with respect to the potential location, wherein the potential location further includes additional tile differences. Estimating the motion of the pixel block in the second receptive field may further include computing a receptive field difference for the potential location by subtracting the sum of the unshared tile differences from the previously computed receptive field difference for the adjacent location and adding to the result of the subtraction the sum of the additional tile differences.

Another aspect is directed towards a method for estimating motion between image frames. The method includes receiving a first input frame and a second input frame. The method further includes dividing the second input frame into a plurality of overlapping receptive fields, wherein adjacent receptive fields of the plurality of receptive fields are offset from one another by a stride value S and each receptive field in the plurality of receptive fields includes a block of pixels having at least 2S pixels in a first dimension and at least 2S pixels in a second orthogonal dimension, forming an at least 2S-by-at-least-2S block of pixels. The method further includes estimating the motion of the pixel block of each receptive field in the plurality of receptive fields relative to a corresponding prior location in the first input frame.

Estimating the motion of the pixel block of each receptive field may further include computing a vector field representing the motion of the pixel block of each receptive field in the plurality of receptive fields relative to a corresponding prior location in the first input frame. Estimating the motion of the pixel block of each receptive field in the plurality of receptive fields relative to a corresponding prior location in the first input frame may further include calculating absolute pixel difference sums for each receptive field in the plurality of receptive fields. At least one receptive field may include a zero-padded portion.

The pixels of the block of pixels of each receptive field of the second input frame may be further grouped into S×S pixel tiles, and estimating the motion of each pixel block in the plurality of receptive fields relative to a prior location in the first input image may include computing a tile difference of each S×S pixel tile in the plurality of receptive fields relative to a number of potential prior locations in the first input frame, wherein the number of potential prior locations is greater than 1. Estimating the motion of each pixel block of the receptive fields in the plurality of receptive fields may further include selecting a first receptive field in the plurality of receptive fields, computing a plurality of tile differences for each S×S pixel tile in the first receptive field relative to a number of potential prior locations of the S×S pixel tiles in the first input frame, wherein the number of potential prior locations of the S×S pixel tiles in the first input frame is greater than 1 and is based on a search radius, and summing the tile differences of each S×S pixel tile in the first receptive field for each of the number of potential prior locations of each S×S pixel tile in the first receptive field to obtain a plurality of receptive field differences. Computing a tile difference may include computing an L-1 normalized difference of the S×S pixel tile. Estimating the motion for each receptive field in the plurality of receptive fields may further include, for the first receptive field, selecting one of the potential prior locations by identifying the potential prior location having a minimum receptive field difference relative to a remainder of potential prior locations of the first receptive field in the first input frame.

Estimating the motion for each pixel block of the receptive fields in the plurality of receptive fields may further include selecting a second receptive field having a plurality of potential prior locations in the first input frame. Estimating the motion of the pixel block in the second receptive field, for each potential location may include obtaining a previously computed receptive field difference for a location in the first input frame adjacent to the potential location, the adjacent location including shared tile differences of the previously computed receptive field difference with respect to the potential location and unshared tile differences of the previously computed receptive field difference with respect to the potential location, wherein the potential location further includes additional tile differences. Estimating the motion of the pixel block in the second receptive field, for each potential prior location may further include computing a receptive field difference for the potential location by subtracting the sum of the unshared tile differences from the previously computed receptive field difference for the adjacent location and adding to the result of the subtraction the sum of the additional tile differences.

Another aspect of the present disclosure is directed towards an artificial intelligence system. The artificial intelligence system includes a processor, a computer readable memory, and a neural network divided into a prefix portion and a suffix portion. The processor is configured to obtain a first input frame, which includes a first plurality of pixel blocks, and designate the first input frame as a key frame. The processor is further configured to cause the first key frame to be processed by the prefix portion of the neural network to obtain a first prefix output, and store the first prefix output in the computer readable memory. The processor is also configured to processes the first prefix output with the suffix portion to obtain a first image result. Additionally, the processor is configured to obtain a second input frame, which includes a second plurality of pixel blocks, and estimate the movement of the second plurality of pixel blocks relative to the first input frame by performing motion estimation to obtain a first vector field. The processor is further configured to process the first prefix output stored in memory based on the vector field to obtain a first predicted output, and cause the first predicted output to be processed by the suffix portion of the neural network to obtain a second image result.

The first and second input frames may include image data, and the system may be a machine vision system. The pixel blocks can be neural network receptive fields.

The neural network may be a convolutional neural network. The neural network may include a plurality of spatially dependent layers followed by at least one spatially independent layer. The prefix may include the plurality of spatially dependent layers, and the suffix may include the at least one spatially independent layer immediately following the spatially dependent layers. The system can include a second processor, wherein causing the first key frame to be processed by the prefix portion of the neural network comprises causing the second processor to process the first key frame, and causing the first predicted output to be processed by the suffix portion of the neural network comprises causing the second processor to process the first predicted output. The second processor can include one of a graphics processing unit and a vector processing unit.

Performing motion estimation may include performing receptive field block motion estimation. The system may include a motion estimation processing unit configured to estimate the movement of the second plurality of pixel blocks relative to the first input frame by performing receptive field block motion estimation to obtain a first vector field.

The system may also be configured to process the stored first prefix output based on the first vector field to obtain a first predicted output by performing bilinear interpolation. Bilinear interpolation may include on-the-fly skip zero decoding. The system may include an interpolation processing unit configured to process the first prefix output stored in memory based on the vector field to obtain a first predicted output.

The system may further be configured to obtain a subsequent input frame, which includes a subsequent plurality of pixel blocks. The system may further be configured to obtain a second vector field by performing block motion estimation to estimate the movement of the subsequent plurality of pixel blocks relative to the first input frame, and to further designate the subsequent input frame as a subsequent key frame. The processor may further be configured to designate the subsequent input frame as a subsequent key frame when the subsequent vector field exceeds a vector threshold. The vector threshold may include a vector field sum, a vector magnitude, or both.

Another aspect is directed towards a method for performing image analysis. The method includes providing a neural network divided into a prefix portion and a suffix portion. The method further includes obtaining a first input frame, which includes a first plurality of pixel blocks, each pixel block including a plurality of pixels, and selecting the first input frame as a first key frame. The method further includes processing the first key frame by the prefix portion to obtain a first prefix output, storing the first prefix output in computer readable memory, and processing the first prefix output by the suffix portion to obtain a first image result. The method further includes obtaining a second input frame, which includes a second plurality of pixel blocks, and estimating the movement of the second plurality of pixel blocks relative to the first input frame by performing motion estimation to obtain a first vector field. The method further includes processing the stored first prefix output based on the vector field to obtain a first predicted output, and processing the first predicted output by the suffix portion to obtain a second image result.

The pixel blocks may be neural network receptive fields. Performing motion estimation may include performing receptive field block motion estimation.

The neural network may be a convolutional neural network. The neural network may include a plurality of spatially dependent layers followed by at least one spatially independent layer, wherein the prefix includes the plurality of spatially dependent layers, and the suffix comprises the at least one spatially independent layer starting with the first spatially independent layer immediately following the spatially dependent layers. The plurality of spatially dependent layers may include at least one convolutional layer, and the at least one spatially independent layer may include at least one fully connected layer.

Processing the stored first prefix output based on the vector field to obtain a first predicted output may further include performing bilinear interpolation on the stored first prefix output. Bilinear interpolation may include on-the-fly skip zero decoding.

The method may further include obtaining a third input frame, which includes a third plurality of pixel blocks, and estimating the motion of the third plurality of pixel blocks by performing motion estimation to obtain a second vector field. The method may further include designating the third input frame as a second key frame when the second vector field exceeds a vector field threshold. The vector field threshold may include one of a vector field sum and/or an individual vector magnitude.

BRIEF DESCRIPTION OF THE DRAWINGS

The accompanying drawings, which are included to provide further understanding and are incorporated in and constitute a part of this specification, illustrate disclosed aspects and together with the description serve to explain the principles of the disclosed aspects.

The following figures are included to illustrate certain aspects of the present disclosure, and should not be viewed as exclusive implementations. The subject matter disclosed is capable of considerable modifications, alterations, combinations and equivalents in form and function, without departing from the scope of this disclosure.

FIGS. 4A-4C are illustrative examples depicting overlapping receptive fields according to exemplary implementations of the present disclosure.

DETAILED DESCRIPTION

Figure 1:
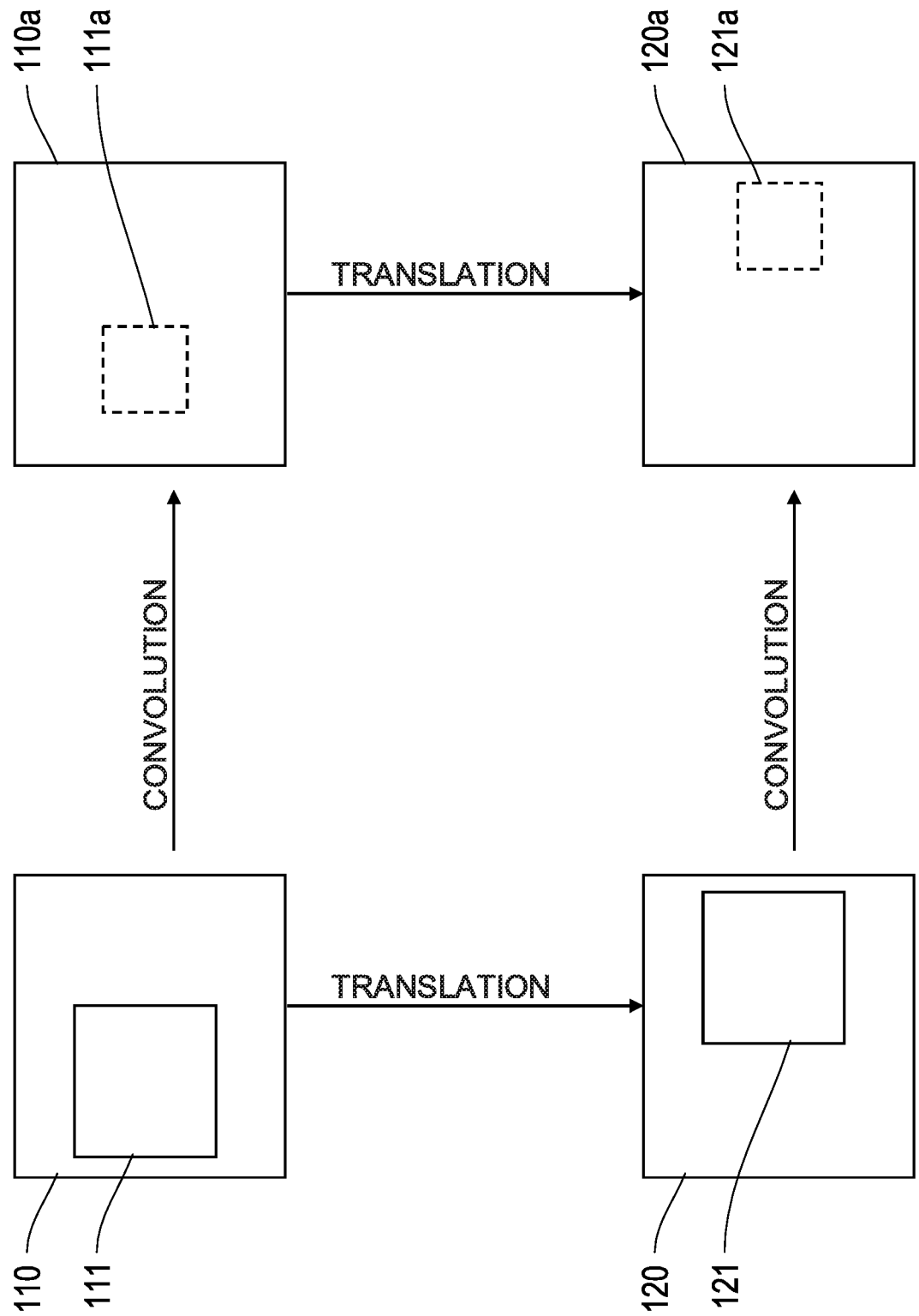
FIG. 1 is an illustrative example showing two input frames and two corresponding neural network outputs being translated according to exemplary implementations of the present disclosure.

The various concepts introduced above and discussed in greater detail below may be implemented in any of numerous ways, as the described concepts are not limited to any particular manner of implementation. Examples of specific implementations and applications are provided primarily for illustrative purposes.

Computer vision deals with designing computers to perform automated tasks such as extracting, processing, analyzing and understanding information from digital images. Common computer vision tasks include object recognition, detection, character recognition, facial recognition, position estimation, and other computer vision tasks known in the art that may require deep machine learning. CNNs are artificial neural networks that can be implemented within devices to facilitate the performance of computer vision tasks. CNNs typically consist of an input layer, an output layer and multiple hidden layers. The hidden layers may consist of convolutional layers, pooling layers and fully connected layers. CNNs may include feed-forward as well as recurrent (non-feed-forward) layers, such as Long Short-Term Memory layers and recurrent convolution layers. Generic CNNs known in the art process images using every one of their layers to extract and classify data, which can require relatively high processing power.

Recent work has explored designing CNN hardware for implementing computer vision capabilities within mobile devices and other systems that typically have limited battery power available for computational processing. However, in attempts to reduce processing power requirements, these designs target generic CNN implementations, and do not exploit specific characteristics of real time computer vision. Real time computer vision relates to performing computer vision tasks on live video. Live video is temporarily redundant. This means that, in many cases, temporally adjacent images frame of an input video only differ slightly from one another. As previously discussed, generic CNNs known in the art may run nearly identical computations for every image frame. However, for real time computer vision implementations, there may exist opportunities to design complementary CNN hardware that exploits specific characteristics of real time vision to reduce the amount of CNN computations that may be required to obtain outputs sufficiently similar to outputs obtained from full CNN computations, and thereby, reducing power consumption and increasing computations speeds.

Existing research has also shown that CNNs can be made naturally approximate. For example, some sparse CNN accelerators known in the art improve the speed and efficiency of CNN computations by configuring a CNN to round smaller input values down to zero, yet still produce outputs sufficiently similar to those generated if the smaller input values were not rounded. Thus, there also exist opportunities to exploit the naturally approximate nature of CNNs.

CNNs contain convolutional layers that scan over an input image using a fixed stride. At each stride, the convolutional layer extracts features within the input image. It does this by generating the dot product of a filter matrix with pixel values of a region, referred to as a receptive field, in the input image, to produce CNN output values. The CNN output values are sometimes described as activations. Each convolutional layer may have one or more channels. Each channel is configured to extract different features from an input image and is associated with its own filter matrix. For example, one channel of a layer may be configured to extract horizontal straight lines, while another channel of that same layer may be configured to extract vertical straight lines. A convolutional layer with three channels will have three filter matrices. The input image region corresponding to each CNN output value may be referred to as a receptive field. By propagating this structure through multiple convolutional layers, the CNN can compute a plurality of activations for each receptive field at each layer. In some implementations, later layers of a CNN use the activations output by earlier layers as their input values, instead of using the original input data (i.e., the original image data).

During live video, the pixels of one input image may appear at a different location (i.e. in the location associated with a difference receptive field) in a subsequent input image. When the pixel values move locations between input images, their corresponding activations move between receptive field locations in the CNNs convolutional layers. That is, mathematically, convolutional layers are said to commute with translation. This means that translating pixels between a first input image and a second input image, and then applying a convolutional layer computation, can yield the result as applying a convolutional layer computation to the first input image and then translating its activation by a corresponding amount.

FIG. 1 is an illustrative example showing two input frames and two corresponding neural network outputs being translated according to exemplary implementations of the present disclosure. The two input frames include a first input frame 110 and a second input frame 120. The two neural network outputs include a first neural network output 110a and a second neural network output 120a. The first input frame 110 corresponds to the first neural network output 110a and the second input frame 120 corresponds to the second neural network output 120a. The term convolution implies applying a convolutional layer computation on an input frame to obtain a neural network output. The first input frame 110 includes a first receptive field 111. The second input frame 120 includes a second receptive field 121. The first neural network output 110a includes a first activation 111a. The second neural network output 120a includes a second activation 121a. With respect to the input frames, the term translation implies motion of pixels between input frames. With respect to the neural network outputs, the term translation implies motion between activations. In some implementations, the first input frame 110 and the second input frame 120 are video frames wherein the second input frame 120 is a subsequent video frame relative to the first input frame 110 in a continuous stream of video frames. While only one reception field is shown in each of the two input frames 110 and 120 for illustrative purposes, the two input frames, and the two neural network outputs, may be divided into a plurality of receptive fields and respective pluralities of activations. The receptive fields 111 and 121 each include a plurality of pixels that make up their corresponding input frames.

As indicated above, applying a convolutional layer computation to the first input frame 110 results in obtaining the first neural network output 110a. During convolutional layer computation, the dot product of a filter matrix, and pixel values of the pixels included in the first receptive field 111, is calculated to obtain the first activation 111a. Similarly, applying a convolutional layer computation to the second input frame 120 results in obtaining the second neural network output 120a.

FIG. 1 shows that when the pixels move between input images from one receptive field to another, their corresponding activations move by a similar amount. In typical CNN real time vision applications, convolutional layer computations are applied to each input image for every convolutional layer of the CNN to produce activations. However, as discussed earlier, translating the pixels between the first input frame 110 and the second input frame 120 and applying convolutional layer computations may be sufficiently similar to applying convolutional layer computations to the first input frame 110 and then translating the activations between the first neural network output 110a and the second neural network output 120a. Thus, opportunities exist to reduce the amount of total CNN computation by implementing efficient means for translating outputs from one image frame to another.

Figure 2:
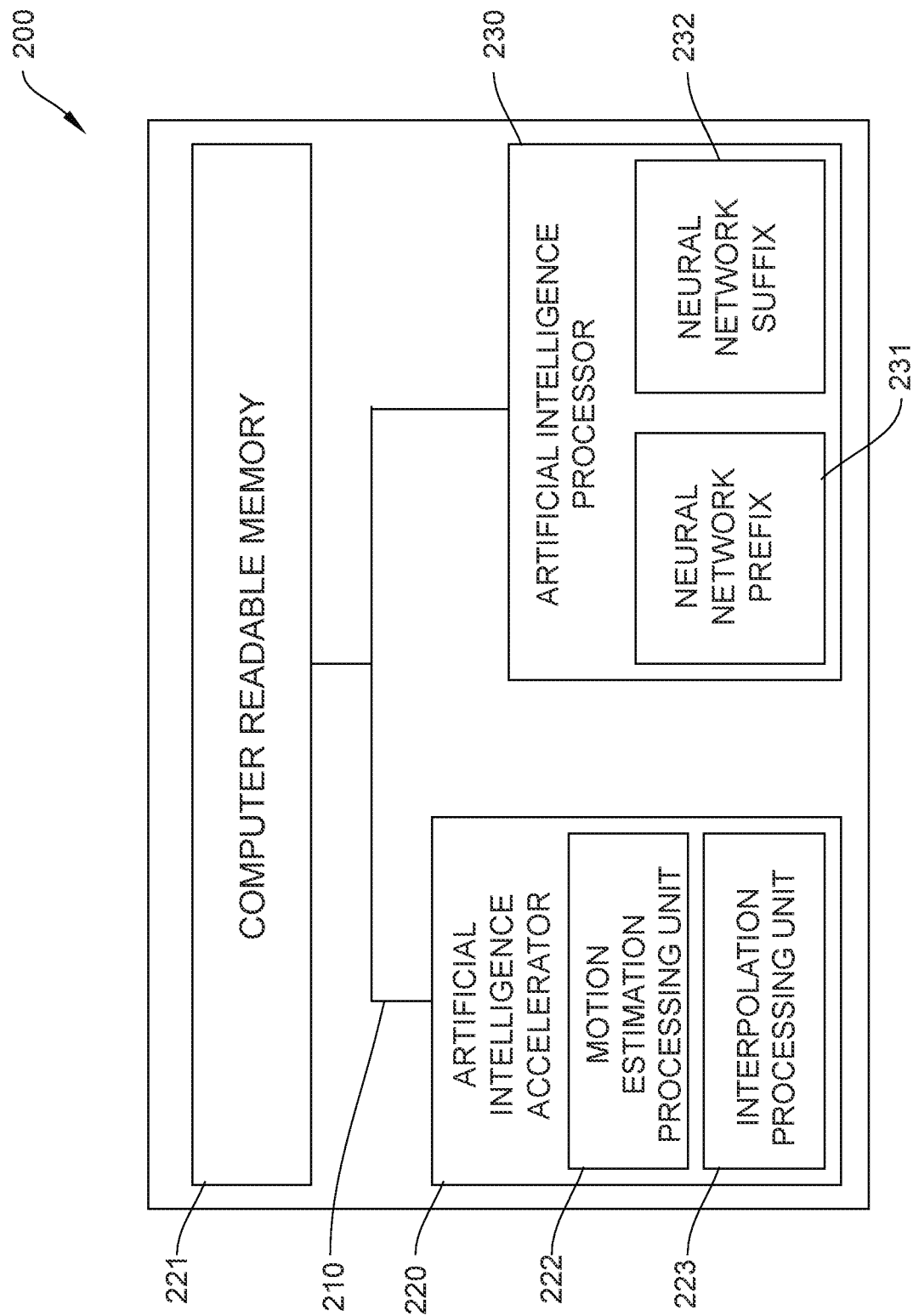
FIG. 2 is an illustrative example of an artificial intelligence system according to exemplary implementations of the present disclosure.
Figure 3:
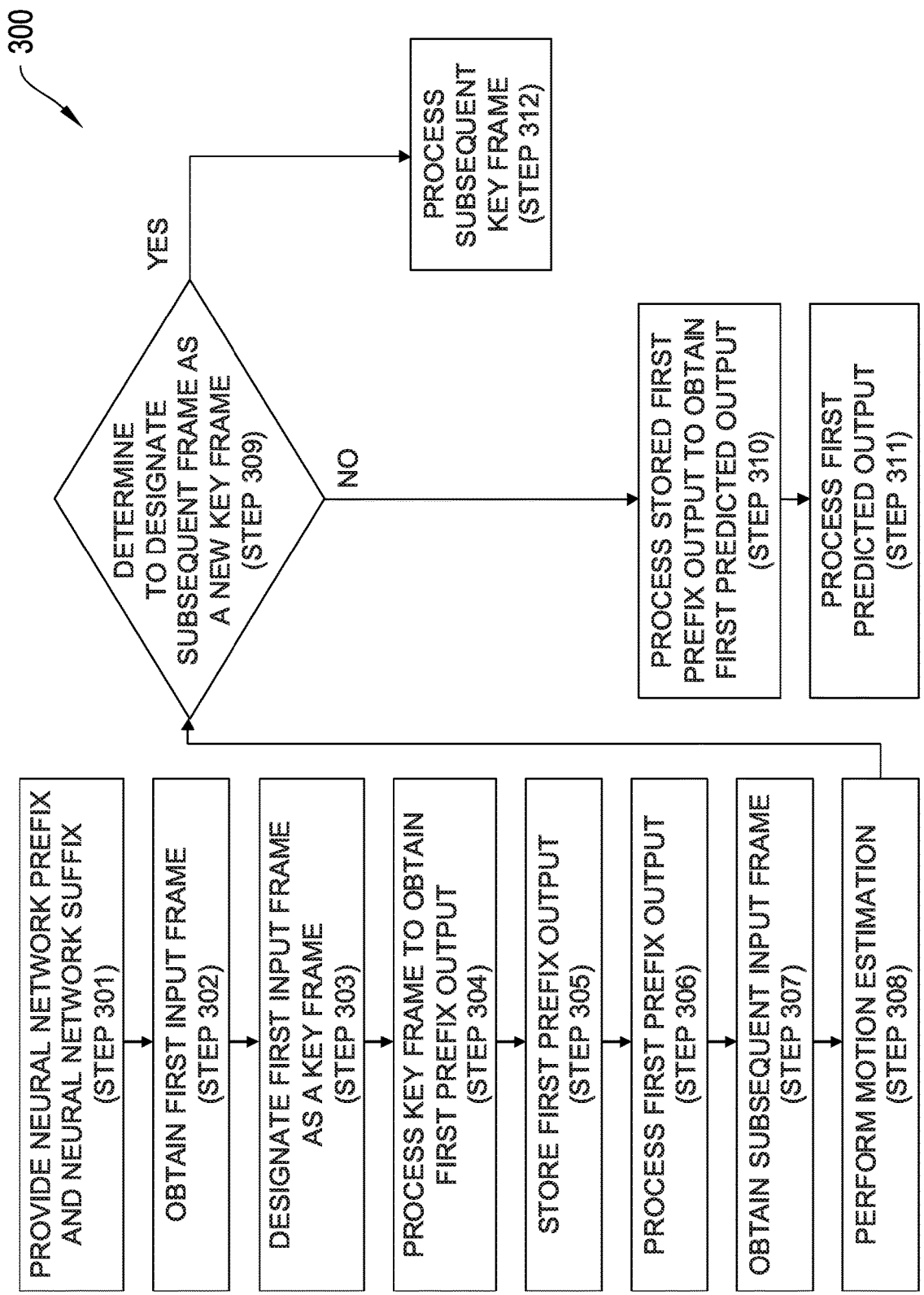
FIG. 3 is a flow chart of a method for performing image analysis according to exemplary implementations of the present disclosure.

FIG. 2 is an illustrative example of an artificial intelligence (AI) system 200 according to exemplary implementations of the present disclosure. FIG. 3 is a flow chart of a method for performing image analysis 300 according to exemplary implementations of the present disclosure using the AI system 200. The AI system 200 includes an AI accelerator 220, a computer readable memory 221, and an AI processor 230. In some implementations, the AI system 200 is a vision processing unit, however the AI system 200 can be other processing units such as a central processing unit, or a general processing unit. The AI accelerator 220, computer readable memory 221, and AI processor 230 are communicatively coupled to each other through a system bus 210. In some implementations, the computer readable memory 221 takes the form of a buffer, though other forms of computer readable memory, such as content addressable memory, cache memory, flash memory, or other forms of computer readable memory may also be used.

In some implementations, the AI accelerator 220 is a microprocessor. In some implementations, the AI accelerator 220 is a graphics processing unit or a vector processing unit. In some implementations, the AI accelerator 220 includes field-programmable gate arrays (FPGA). In some implementations, the AI accelerator 220 is a dedicated application-specific integrated circuit (ASIC). The AI accelerator 220 includes a motion estimation processing unit 222 and an interpolation processing unit 223. The motion estimation processing unit 222 is configured to perform motion estimation. The interpolation processing unit 223 is configured to perform decoding and interpolation. In some implementations, the motion estimation processing unit 222 and the interpolation processing unit 223 are ASICs. In some implementations, the motion estimation processing unit 222 and the interpolation processing unit 223 include computer readable instructions executed on the AI accelerator 220.

The AI processor 230 includes a neural network prefix 231 and a neural network suffix 232. The neural network prefix 231 and the neural network suffix 232 correspond to distinct portions of a CNN. In some implementations, the neural network prefix 231 includes a plurality of CNN layers and the neural network suffix 232 includes at least one fully connected layer that follows the plurality of CNN layers. In some implementations, the neural network suffix 232 does not include a fully connected layer. In some implementations, the neural network prefix 231 and the neural network suffix 232 are provided as software executed on the AI processor 230. In some implementations, the neural network prefix 231 and the neural network suffix 232 are implemented as dedicated ASICs. In some implementations, the neural network prefix 231 and the neural network suffix 232 are distinct portions of neural networks known in the art other than CNNs. For instance, the neural network prefix 231 and the neural network suffix 232 may form portions of other types of neural networks, such as radial basis function neural networks, self-organizing neural networks, and recurrent neural networks. Generally, the neural network prefix 231 and the neural network suffix 232 can form distinct portions of any neural network in which one or more layers produce outputs which have a direct spatial relationship to a subset of spatial input data.

As discussed earlier, the AI system 200 is configured to execute the method for performing image analysis 300 as described in FIG. 3. The method for performing image analysis 300 includes: providing a neural network prefix and a neural network suffix (step 301); obtaining a first input frame (step 302); designating the first input frame as a first key frame (step 303); processing the key frame to obtain a first prefix output (step 304); storing the first prefix output (step 305); processing the first prefix output (step 306); obtaining a subsequent input frame (step 307), performing motion estimation (step 308); and determining if the subsequent frame should be designated as a new key frame (step 309). If the subsequent input frame is not designated as a new key frame, the method for performing image analysis 300 further includes processing the stored first prefix output to obtain a first predicted output (step 310) and processing the first predicted output (step 311). If the subsequent input frame is designated as a new key frame, the method for performing image analysis includes processing the subsequent key frame (step 312).

The method for performing image analysis 300 includes providing a neural network prefix and a neural network suffix (step 301). This includes dividing a neural network into a prefix portion and a suffix portion. As previously discussed, the neural network prefix 231 and the neural network suffix 232 can be implemented as part of the AI processor 230 of the AI system 200 shown in FIG. 2. The neural network prefix 231 and the neural network suffix 232 are distinct portions of a CNN. One important determination to be made includes which CNN layers to include in the neural network prefix 231 and the neural network suffix 232. As will be shown later, this means deciding which layer's activations should be saved and later translated, and which will be computed for every image frame. In typical CNN designs, the earlier layers are configured to perform generic feature extraction, while the later layers perform task oriented operations. These later layers may not have a 2D spatial structure and can have a non-linear relationship with the motion between the input frames. Accordingly, translating the activations at these layers may be difficult and can cause unpredictable errors. Consequently, a larger neural network prefix may allow the AI system 200 to skip more neural network computations but can also compound the influence of the later non-spatial layers. It may therefore be preferable to include spatial layers in the neural network prefix while including the non-spatial layers in the neural network suffix.

As indicated above, the method for performing image analysis 300 includes obtaining a first input frame (step 302). This includes receiving a first input frame and storing the first input frame in memory. The computer readable memory 221 of the AI system 200 of FIG. 2 is configured to receive the first input frame. In some implementations, the first input frame corresponds to a first video frame from either a live video stream or a prerecorded video playback stream. The AI processor 230 is configured to retrieve the first input frame from the computer readable memory 221 and divide the first input frame into a plurality of pixel blocks. In some implementations, the pixel blocks are receptive fields. As discussed earlier, receptive fields are portions of the input frame for which activations are calculated at a given CNN layer for each of its channels. The receptive fields overlap such that adjacent receptive fields are offset from one another by what is referred to as a receptive field stride. The receptive field stride is equal to a number of pixels and is a predetermined characteristic of a CNN layer. Larger strides can lead to less CNN computations and may result in CNN outputs with smaller spatial dimensions. Smaller strides can lead to more CNN computations and may result in CNN outputs with larger spatial dimensions.

The method for performing image analysis 300 also includes designating the first input frame as a key frame (step 303). This includes storing the first input frame in the computer readable memory 221 and designating it as a key frame. As discussed later, designating the first input frame as a key frame means that the AI accelerator 220 will later retrieve the key frame and use it as a reference frame for motion estimation computations. Also, as discussed later, designating the first input frame as a key frame means that both the neural network prefix 231 and the neural network suffix 232 will both perform CNN computations on the first input frame.

As indicated earlier, the method for performing image analysis 300 includes processing the first key frame to obtain a first prefix output (step 304). This includes causing the neural network prefix 231 to process the first key frame to obtain a first prefix output. The AI processor 230 of the AI system 200 is configured to obtain the first key frame from the computer readable memory 221 and divide the first key frame into a plurality of pixel blocks. In some implementations, the pixel blocks are receptive fields. As discussed earlier, receptive fields are portions of the input frame upon which activations are computed in a CNN layer. The receptive fields overlap such that adjacent receptive fields are offset from one another by a receptive field stride. The receptive field stride is a predetermined characteristic of a CNN layer. The neural network prefix 231 is further configured to perform CNN computations on the first key frame to obtain a first prefix output. Performing CNN computations includes, for each receptive field, computing the dot product of a filter matrix, and pixel intensity values of the receptive field, at each layer in the neural network prefix 231 to obtain activations corresponding to the channels of each receptive field. In some implementations, the activations calculated at one layer of the CNN are treated as pixel values in a later layer of the CNN. That is, an array of activation values for a set of receptive fields can serve as input for a later layer of the CNN. As discussed earlier, each layer may include a plurality of channels. The plurality of activations computed by the neural network prefix 231 defines a first prefix output. Thus, the first prefix output includes activations representing each channel for every layer in the neural network prefix 231. As known in the art, the various filter matrices employed for each channel allow each CNN layer to extract different features within the input frame. For example, a filter matrix used in one layer's channel may facilitate the extraction of features such as straight horizontal lines, while the filter matrix used in another channel may facilitate extraction of straight vertical lines. The filter matrix used in a channel of a later layer may facilitate the extraction of facial features. In this sense, the first prefix output can be described as having a plurality of activations defining a feature map for each channel.

Storing the first prefix output (step 305) includes storing the first prefix output in computer readable memory. After the neural network prefix 231 processes the first input frame to obtain a first prefix output, the AI Processor 230 sends the first prefix output to the AI accelerator 220. The AI accelerator 220 compresses the first prefix output and sends the compressed first prefix output to the computer readable memory 221 for storage. In some implementations, the AI accelerator 220 compresses the first prefix output by performing run length encoding on the first prefix output. Run length encoding can be a form of lossless data compression known in the art in which runs of data are stored as a single data value and count, rather than as the original run. Runs of data imply sequences in which the same data values occur in consecutive data elements. In some implementations, the AI accelerator 220 run length encoding includes zero gap run length encoding. Zero gap run length encoding may be a form of run length encoding in which data is stored as pair of values, where one value is a non-zero value followed by a count of following zeros. Zero gap run length encoding may be preferred to compress neural network outputs because a given plurality of activations produced by the CNN's layers may be sparse. This means that many of the activations corresponding to the channels of a CNN layer may contain a value of zero, creating several runs of zero values. These runs of zero values may be referred to as zero-gaps. For each zero-gap of activation values, the AI accelerator 220 encodes the activation data by assigning a zero gap to a non-zero activation value. For example, a run of four zeros followed by an activation value of 5, may be encoded as $5_{(4)}$, wherein 5 is the non-zero activation value and (4) is the zero-gap preceding the non-zero activation value.

The method for performing image analysis 300 further includes processing the first prefix output to obtain a first image result (step 306). This includes causing the neural network suffix 232 to process the first prefix output to obtain a first image result. After the first key frame is processed by the neural network prefix 231 to obtain the first prefix output, the neural network prefix 231 is configured to send the first prefix output to the neural network suffix 232. The neural network suffix 232 is configured to perform CNN computations on the first prefix output to obtain a first image result based on a plurality of activations corresponding to the CNN layer's channels. As previously discussed, the neural network suffix 232 can include at least one fully connected layer that follows the convolutional layers of the neural network prefix 231. In some implementations, the neural network suffix 232 lacks a fully connected layer. In some implementations, the first image result corresponds to at least one task related to computer vision. For example, the first image result may include a plurality of values corresponding to object detection, facial recognition, object position estimation, and other related computer vision tasks known in the art.

Obtaining a subsequent input frame (step 307) includes obtaining a subsequent input frame and dividing the subsequent input frame into a subsequent plurality of pixel blocks. In some implementations, the subsequent input frame is a video frame that follows the first input frame in the continuous stream of live or prerecorded video frames. The AI system 200 is configured to receive the subsequent video frame and send it to the AI accelerator 220. The AI accelerator 220 then divides the subsequent input frame into a second plurality of pixel blocks, such as overlapping receptive fields.

Performing motion estimation (step 308) includes performing motion estimation to estimate the movement of the second plurality of pixel blocks relative to the first plurality of pixel blocks. After the AI accelerator 220 divides the subsequent input frame into a plurality of pixel blocks, it is configured to retrieve the key frame and estimate the motion of each pixel block in the subsequent input frame relative to the key frame (e.g. a pixel block in the subsequent input frame may have moved three pixels to the right and one pixel down from where it was in the key frame). Based on this estimated motion, the AI accelerator 220 is configured to generate a vector field. The vector field includes one vector for each pixel block in the subsequent input frame. Each vector in the vector field indicates the estimated motion of a given pixel block in the subsequent input frame relative to the key frame. In some implementations, performing motion estimation includes performing receptive field block motion estimation, which is described later in the discussion regarding FIG. 5. However, in some implementations other methods of motion estimation may be used. For example, in some implementations, performing motion estimation includes performing pixel level motion estimation by using techniques known in the art.

As indicated earlier, the method for performing image analysis further includes determining if the subsequent input frame should be designated as a new key frame (step 309). Once the AI accelerator 220 computes the vector field, the AI accelerator 220 can make the determination of whether to designate the subsequent input frame as a new key frame by comparing one or more characteristics of the vector field to a vector field threshold. In some implementations, the vector field threshold can be a threshold magnitude sum of vectors. This means, that the magnitudes of the vectors within the vector field can be summed, and the resulting value of this vector magnitude sum can be compared with a threshold value. In these implementations, if the sum for the magnitudes of each vector within the vector field is greater than the threshold value, the AI accelerator 220 designates the subsequent input frame as a new key frame. Conversely, if the sum for the magnitudes of each vector within the vector field is lesser than or equal to the maximum vector magnitude sum, the AI accelerator 220 does not designate the subsequent input frame as a key frame. In some implementations, if the magnitude of more than a threshold number of vectors within the vector field exceeds a threshold magnitude, the AI accelerator 220 designates the subsequent input frame as a key frame. For example, assume that the number of vectors threshold is three, and the magnitude threshold is thirty pixels. In this instance, if the vector magnitudes of more than three vectors in the vector field are greater than thirty pixels, than the AI accelerator 220 will designate the corresponding subsequent image frame as a key frame. The vector field threshold can also be a vector field magnitude mean, a threshold vector field magnitude median, and so on. Alternatively, the AI accelerator 220 can make the determination to designate the subsequent input frame as a new key frame based on a designation rate. For example, the AI accelerator 220 can designate every other subsequent frame as a new key frame. The AI accelerator 220 can also designate every third subsequent frame as a new key frame. The rate at which subsequent key frames are chosen can be predetermined and based on the level of power savings and accuracy desired while performing motion estimation.

If it is determined the subsequent image frame is not to be designated as a key frame, the method for performing image analysis 300 also includes processing the stored first prefix output to obtain a first predicted output (step 310). This includes processing the stored first prefix output based on the vector field obtained while performing motion estimation (step 308). The AI accelerator 220 applies the vector field to the first prefix output and translates the activations within the first prefix output according to the vector field to obtain a first predicted output. As later described in FIG. 12, the AI accelerator 220 may scale the vector field because dimensions of the input frames may differ from the dimensions of the CNN output. However, scaling the vector field may lead to the vector field having vectors with fractional values. To deal with this potential problem, the AI accelerator 220 is configured to interpolate between activation values of the first prefix output to obtain the activation values to use as the first predicted output. In some implementations, interpolating between activation values includes performing bilinear interpolation.

After the first predicted output is generated, the first predicted output is processed to obtain a second image result (step 311). Processing the first predicted output includes causing the neural network suffix 232 to process the first predicted output to obtain a second image result. Once the AI accelerator 220 obtains the first predicted output, the AI accelerator 220 sends the first predicted output to the neural network suffix 232 for further processing. The neural network suffix 232 applies CNN computations on the first predicted output to obtain a second image result. In some implementations, the second image result corresponds to at least one task related to computer vision. For example the result may include values corresponding to object detection, facial recognition, object position estimation, and other related computer vision tasks known in the art.

If the subsequent input frame is designated as a new key frame, then the method for image analysis includes processing the new key frame (step 312). This includes causing both the neural network prefix portion and the neural network suffix portion to process the subsequent key frame to obtain the second image result. If the AI accelerator 220 designates the subsequent input frame as a new key frame, it sends the new key frame to the AI processor 230. The AI processor 230 uses both the neural network prefix 231 and the neural network suffix 232 to perform full CNN computations on the subsequent key frame. In some implementations, the neural network prefix 231 processes the new key frame to obtain a subsequent prefix output, which can be stored in the computer readable memory 221. The subsequent prefix output can be used for motion estimation on later input frames. The previously designated key frame can then be discarded.

The functionality of the AI system 200 of FIG. 2 may be similar to applying convolutional layer computations to the first input frame 110 and then translating the activations between the first neural network output 110a and the second neural network output 120a. That is, the AI system 200 may simulate translating the activations between neural network outputs based on estimating the translation between the input frames. In general, the AI system 200 may perform full CNN computations on key frames, and then predict prefix outputs for non-key frames. Consequently, the AI system 200 may reduce processing power requirements by not performing full CNN computations on non-key frames. One problem with predicting the activations for non- key frames may be that some motion estimation techniques can have limited accuracy. This can affect the CNN's ability to accurately track features and objects between input frames. However, motion estimation techniques that produce highly accurate results often require increased processing power, which can diminish the power savings realized by not requiring full CNN execution for every frame. Thus, an efficient technique for estimating the translation between input frames that can increase computational speed while producing outputs that sufficiently maintain the integrity of the input image is desirable.

One way to obtain sufficiently high fidelity motion estimation while not unduly increasing power consumption is to exploit the properties of receptive fields. For example, the receptive fields in many CNN designs are typically much larger than the stride value, so separately adjacent receptive fields overlap significantly and opportunities to exploit redundancy exist.

Figure 4B:
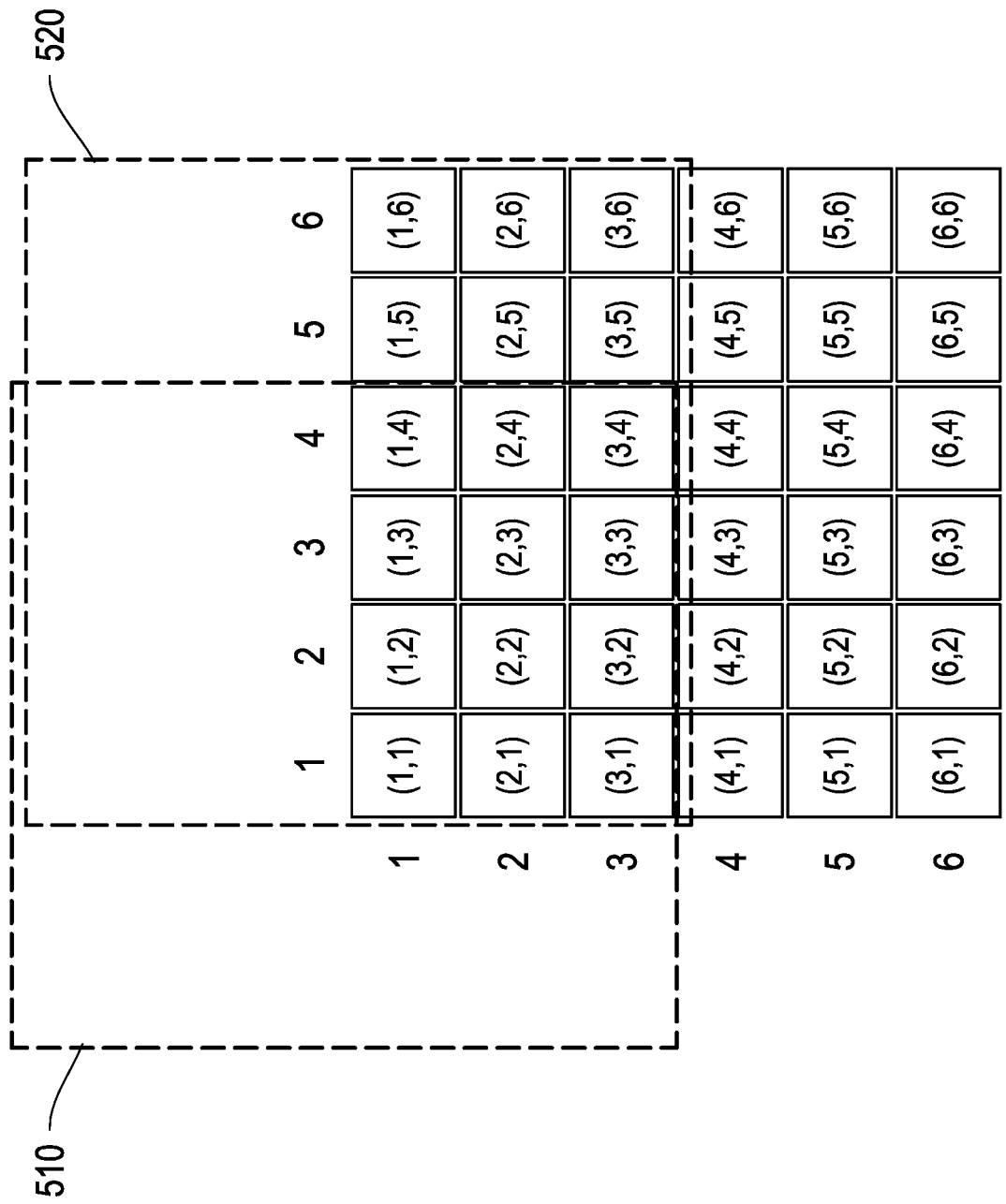
Figure 4C:
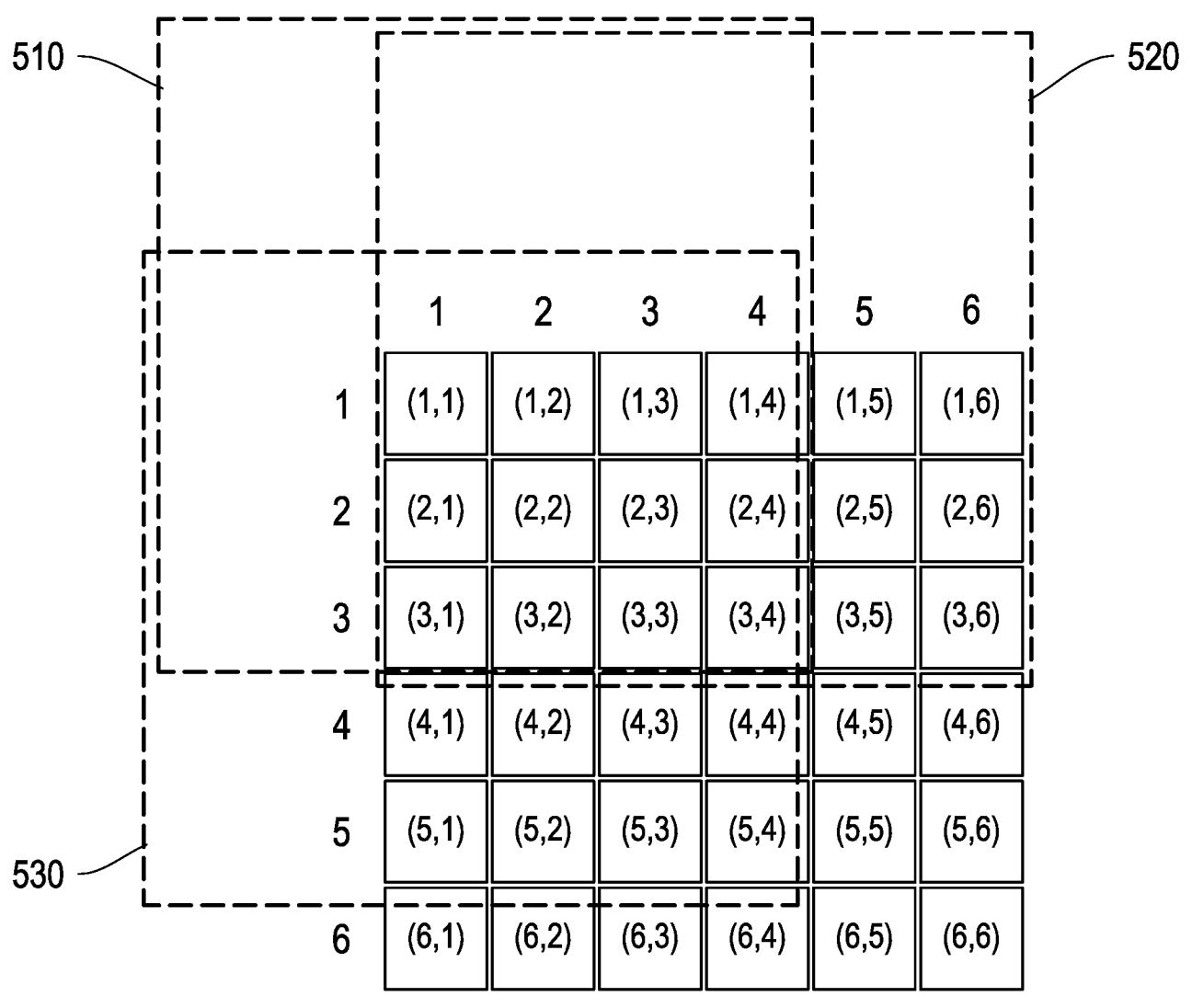

FIGS. 4A-4C are illustrative examples depicting overlapping receptive fields according to exemplary implementations of the present disclosure. Referring to FIG. 4A, an input image 501 and a first receptive field 510 are shown. For illustrative purposes, the input image 501 includes a six-by-six array of pixels; however the input image 501 may include a pixel array consisting of other numerical dimensions. For illustrative purposes, the rows and columns of the pixel array in input image 501 have been numbered. Also for illustrative purposes, the pixels have been labeled to indicate their positioning by row and column within the pixel array. For example, the pixel located within the first row and the first column is labeled (1,1), while the pixel located within the sixth row and the sixth column is labeled (6,6). The first receptive field 510 includes a portion of the pixel array and an out-of-bounds portion which extends beyond the input image's dimensions. Configuring certain receptive fields to include an out-of-bounds portion is a technique known in the art described as zero-padding. In some implementations, zero-padding allows a neural network to preserve the spatial size of an input image's volume such that when the input image propagates through the neural networks layers, the resulting output will have substantially similar spatial dimensions as the input image.

Referring to FIG. 4B, the input image 501, the first receptive field 510, and a second receptive field 520 are shown. The second receptive field 520 is offset from the first receptive field 510 by a stride in the horizontal direction. In this illustrative example, the stride has a value of 2. The second receptive field 520 is offset from the first receptive field 510 such that the second receptive field 520 shares a set of pixels with the first receptive field 510 and the second receptive field 520 further includes an additional set of pixels. As shown in FIG. 4B, the shared set of pixels are pixels (1,1), (1,2), (1,3), (1,4), (2,1), (2,2), (2,3), (2,4), (3,1), (3,2), (3,3), and (3,4). The additional set of pixels included in the second receptive field 520 are pixels (1,5), (1,6), (2,5), (2,6), (3,5), and (3,6).

Referring to FIG. 4C, the input image 501, the first receptive field 510, the second receptive field 520, and a third receptive field 530 are shown. The third receptive field 530 is offset from the first receptive field 510 by the stride in the vertical direction. The third receptive field 530 includes a set of pixels that are shared with both the first receptive field 510 and the second receptive field 520. The third receptive field 530 also includes an additional set of pixels. As shown in FIG. 4C, the additional set of pixels of the third receptive field 530 include pixels (4,1), (4,2), (4,3), (4,4), (5,1), (5,2), (5,3) and (5,4). In some implementations, the pixel array of the input image 501 can be treated as an array of pixel tiles, wherein each pixel tile includes a plurality of pixels. In some implementations the pixel tiles include an S-by-S array of pixels, wherein S is the stride. Thus, if the receptive field 520 and the receptive field 530 are offset from the first receptive field 510 by a stride having a value of two, for example, the pixel tiles will include a two-by-two array of pixels.

As FIGS. 4A-4C show, the receptive fields corresponding to a neural network overlap and share several pixels. When performing motion estimation as per some implementations described in FIG. 2, the motion of the receptive fields corresponding to the input image 501 may be estimated relative to potential prior locations of those receptive fields in a previous input frame. This may be done by calculating the differences of the pixels, or pixel tiles in some implementations, within the receptive fields to a plurality of pixels in a previous input frame. Due to the overlap, opportunities may exist to reuse the results of calculations performed for the first receptive field 510 to estimate the motion of the second receptive field 520 relative to a plurality of receptive fields in a previous input frame. In practical implementations, the receptive fields' size and suitable strides can include a range of values. For example, a CNN known in the art as AlexNet includes receptive fields having an eleven-by-eleven dimensional size which are offset by a stride of four pixels. Another CNN known in the art as VGGNet can include receptive fields having a three-by-three dimensional size which are offset by a stride of one pixel. The CNN known in the art as GoogLeNet can include receptive fields having a seven-by-seven dimensional size which are offset by a stride of two pixels. Receptive fields having sizes up to 256-by-256, or more, which are offset by a stride of up to 64 pixels or more may also be suitable for use within the processes and exemplary discussions herein. In general, it is desirable for the receptive field dimensions to be at least twice the size of the stride value.

Figure 5:
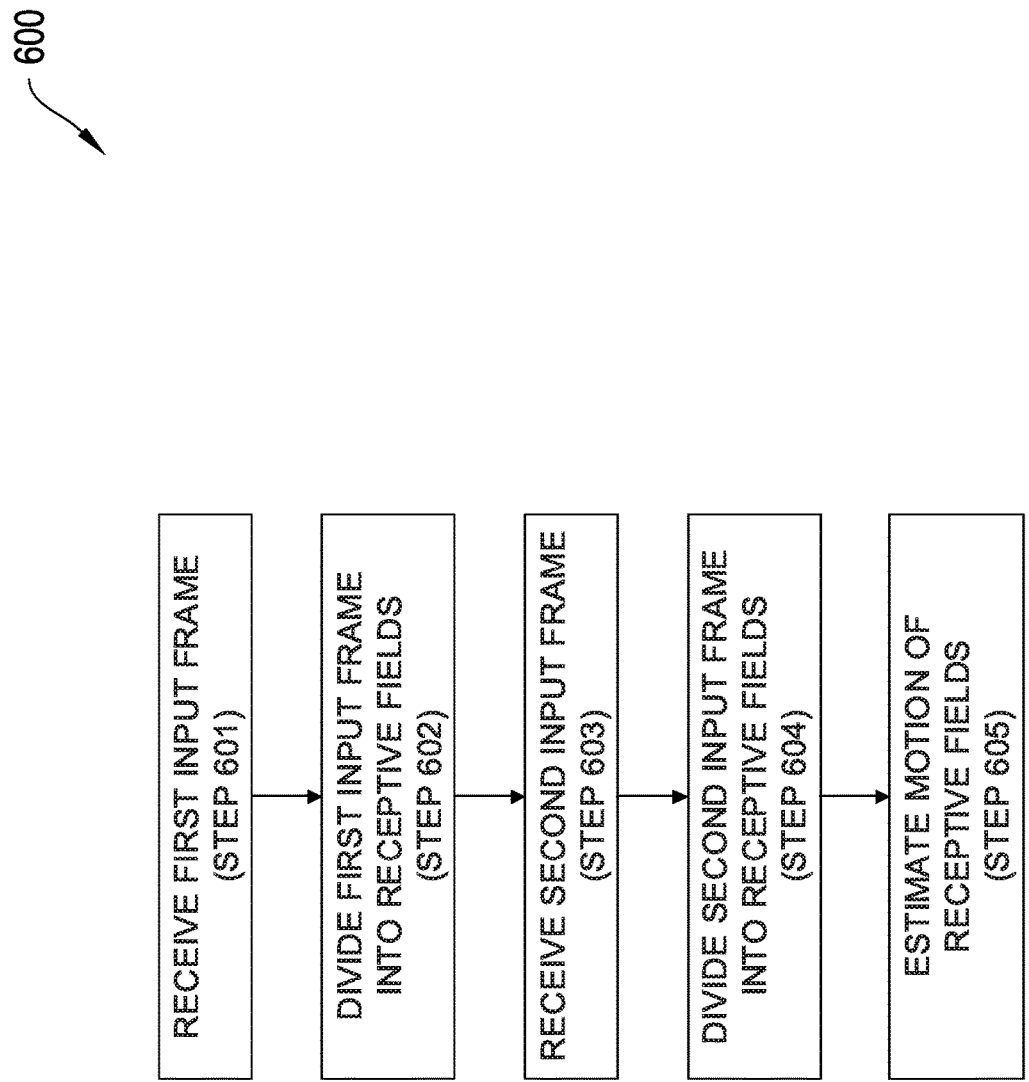
FIG. 5 is a flow chart depicting a method for estimating motion between image frames according to exemplary implementations of the present disclosure.

FIG. 5 is a flow chart depicting a method for estimating motion between image frames 600 according to exemplary implementations of the present disclosure which may be performed by the motion estimation processing unit 222 of FIG. 2. The method for estimating motion between image frames 600 includes receiving a first input frame (step 601), dividing the first input frame into receptive fields (step 602), receiving a second input frame (step 603), dividing the second input frame into receptive fields (step 604), and estimating the motion of receptive fields (step 605).

As indicated above, the method for estimating motion between image frames 600 includes receiving a first input frame (Step 601). The motion estimation processing unit 222 is configured to receive a first input frame. In some implementations, the first input frame has been designated as a key frame.

The method for estimating motion between image frames 600 also includes dividing the first input frame into receptive fields (Step 602). As discussed earlier, the first input frame can be divided into a first plurality of overlapping receptive fields. The first plurality of overlapping receptive fields may overlap similar to the receptive fields of FIG. 4C. That is, the receptive fields of the first plurality of overlapping receptive fields are offset from adjacent receptive fields by a stride value S. The receptive fields of the first plurality of overlapping receptive fields include a block of pixels having at least 2S pixels in a first dimension, and at least 2S pixels in a second orthogonal dimension to form an at least 2S-by-at-least-2S block of pixels.

The method for estimation motion between image frames 600 also includes receiving a subsequent input frame (Step 603). As mentioned earlier, the motion estimation processing unit 222 is configured to receive a subsequent input frame.

As indicated above, the method for estimating motion between image frames 600 includes dividing the subsequent input frame into receptive fields (Step 604). As discussed earlier, the subsequent input frame can be divided into a subsequent plurality of overlapping receptive fields.

The method for estimation motion between image frames 600 also includes estimating the motion of receptive fields (Step 605). The motion estimation processing unit 222 is configured to estimate the motion of each receptive field in the subsequent plurality of overlapping receptive fields from the subsequent input frame relative to a corresponding prior location in the first input frame. For each receptive field in the subsequent input frame, the motion estimation processing unit 222 compares the pixel intensities of the pixels within the receptive field in the subsequent input frame with the pixel intensities of a number of potential prior locations for the pixels of the receptive field in the first input frame. As later described in the discussion regarding FIGS. 6A and 6B, the number of potential prior locations is based on one or more search parameters. In some implementations, the search parameters include a search radius. In some implementations, the search parameters include a search stride. In some implementations, the search parameters include both a search radius and a search stride.

The motion estimation processing unit 222 computes the absolute pixel difference (APD) of each pixel within the receptive field in the subsequent input frame relative to the pixels at the potential prior locations in the first input frame to generate a plurality of absolute pixel differences. For each potential prior location in the first input frame of the receptive field in the subsequent input frame, the motion estimation processing unit 222 computes the sum of absolute pixel difference (SAPD) relative to the given receptive field in the subsequent image frame. The motion estimation processing unit 222 then selects the potential prior location in the first input frame with the minimum SAPD as the estimated prior location of a given receptive field in the first image frame. In some implementations, the motion estimation processing unit 222 computes the L-1 normalized SAPD, as known in the art, for each potential prior location in the first input frame of the receptive field in the subsequent input frame. In these implementations, the motion estimation processing unit 222 determines that the potential prior location in the first input frame corresponding to the minimum L-1 normalized SAPD is the prior location of the receptive field. While the above description discusses evaluating portions of image frames based on absolute pixel differences and SAPDs, in some implementations, other individual and aggregate pixel difference metrics may be used instead of absolute pixel differences, such a percentage differences, pixel difference variances, mean pixel differences, etc.

Figure 6A:
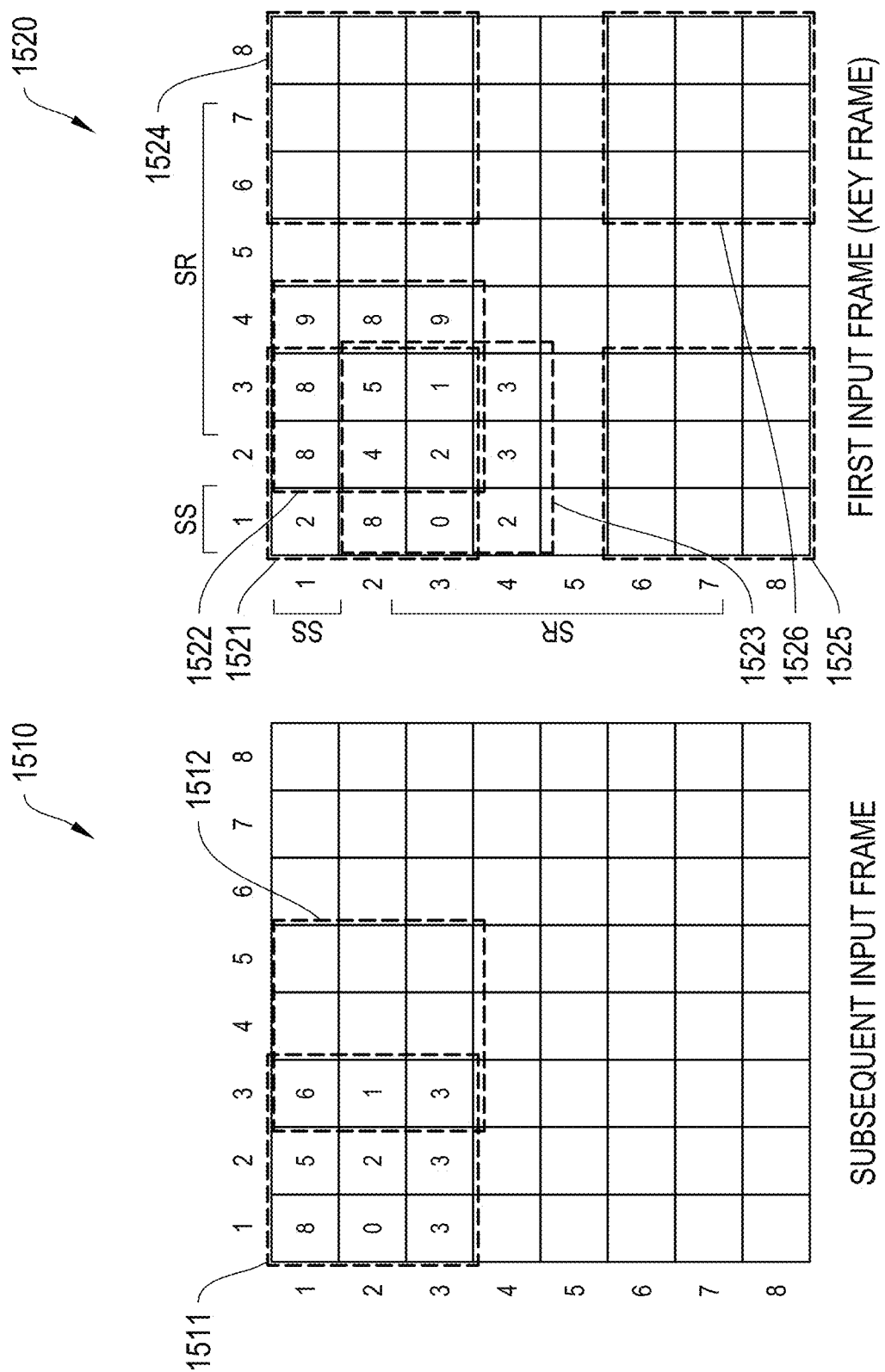
FIGS. 6A and 6B are an illustrative example depicting a motion estimation processing unit determining a prior location of a receptive field according to exemplary implementations of the present disclosure.
Figure 6B:
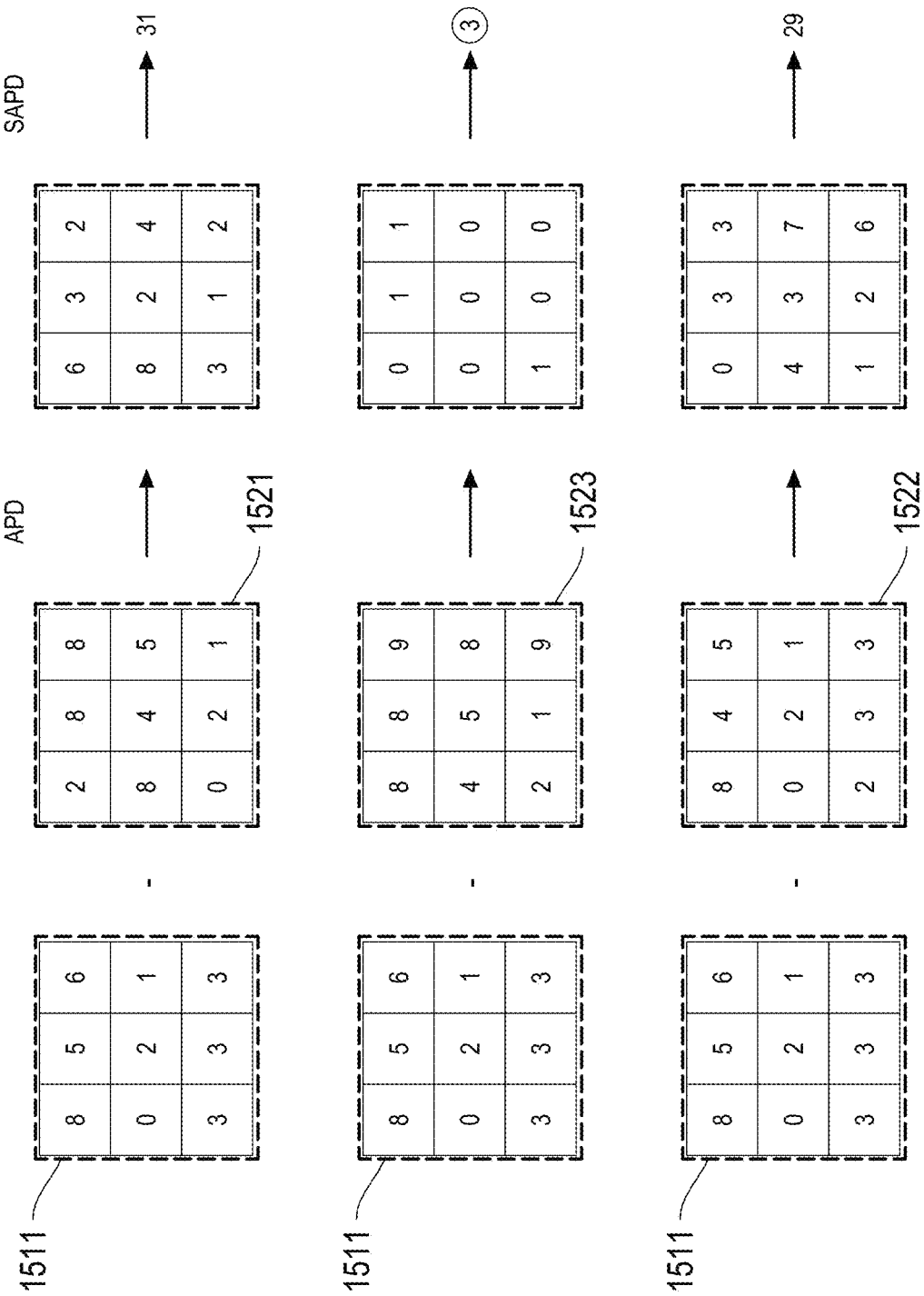

FIGS. 6A and 6B are an illustrative example depicting the motion estimation processing unit 222 determining the prior location of a receptive field according to exemplary implementations of the present disclosure. Referring to FIGS. 6A and 6B, a first input frame 1520 and a subsequent input frame 1510 are shown. As indicated earlier, the first input frame 1520 can be a key frame. The first input frame 1520 and the subsequent input frame 1510 include an eight-by-eight array of pixels. For illustrative purposes, the pixels will be referred to by their positioning within the pixel array, similar to the pixels of FIGS. 4A-4C except that the labels are not shown. Thus, for example, the pixel located at the top left corner of the subsequent input frame 1510, or row 1 and column 1, may be referred to as pixel (1,1). Similarly, the pixel located at the bottom left corner of the subsequent input frame 1510, or row 8 and column 1, may be referred to as pixel (8,1). The subsequent input frame 1510 includes a first receptive field 1511 and a second receptive field 1512. The first receptive field 1511 is a receptive field for which the motion estimation processing unit 222 is currently identifying an estimated prior location. The second receptive field 1512 is offset by a stride of two in the horizontal direction from the first receptive field 1511. For illustrative purposes, only two receptive fields of the subsequent input frame 1510 are shown, however the subsequent input frame 1510 may have more overlapping receptive fields.

The first receptive field 1511 includes a three-by-three array of pixels, which is a portion of the array of pixels in the subsequent input frame 1510. The numbers centered within the pixels indicate the pixel intensity value of the pixel. So, for example, pixel (1,1) has a pixel intensity value of 8, and pixel (1,2) has a pixel intensity value of 5. For illustrative purposes, only the pixel intensity values for the pixels within the first receptive field 1511 are shown, however the pixels within the second receptive field 1512 will also have corresponding pixel intensity values.

The first input frame 1520 includes a plurality of potential prior locations of the first receptive field. Several of these potential prior locations are shown for illustrative purposes. For example, FIG. 6A shows a first potential prior location 1521, a second potential prior location 1522, a third potential prior location 1523, a fourth potential prior location 1524, a fifth potential prior location 1525, and a sixth potential prior location 1526. The potential prior locations have been chosen based on a search radius (SR) of five and a search stride (SS) of one. That is, for the first receptive field 1511, the motion estimation processing unit 222 will search potential prior locations in the first input frame 1520, starting with the first potential prior location 1521, which spatially corresponds to the current position of the first receptive field 1511, and moving towards the outer bounds of the search radius, which is defined by potential prior locations 1525, 1526, and 1524, at one pixel increments. For illustrative purposes, a search stride of one was chosen. However, if the search stride is two, the search will start at the potential prior location corresponding to current position of the first receptive field 1511, and move towards the outer bounds of the search radius at two pixel intervals. As with the first receptive field 1511, the potential prior locations of the first input frame 1520 include three-by-three arrays of pixels. Also, the values centered within these pixels represent their pixel intensity values. Only a select number of potential prior locations in the first input frame 1520 are shown for illustrative purposes. However, the first input frame 1520 includes more overlapping potential prior locations given the aforementioned search radius and search stride.

As shown in FIG. 6B, the motion estimation processing unit 222 computes the APD between pixel intensity values of the pixels within the first receptive field 1511, with the pixel intensity values of the pixels within the potential prior locations in the first input frame 1520. For illustrative purposes, the APDs between the first receptive field 1511 and the first potential prior location 1521, the second potential prior locations 1522, and the third potential prior location 1523 are shown. However, the motion estimation processing unit 222 will compute APDs between the first receptive field 1511 and all potential prior locations within the boundaries of the search radius according to the search stride. Then, the motion estimation processing unit 222 computes the SAPD between the first receptive field 1511 and each potential prior location. The motion estimation processing unit 222 then selects the potential prior location in the first input frame 1520 corresponding to the lowest SAPD as the estimated prior location in the first input frame 1520 for the first receptive field 1511 of the subsequent input frame 1510.

Referring back to step 605 of FIG. 5, for each receptive field in the subsequent input frame, the motion estimation processing unit 222 generates a vector representing the offset between the receptive field in the subsequent input frame and the potential prior location associated with the minimum SAPD. The totality of these vectors defines a vector field. As indicated above, the first input frame may be a key frame. In that case, the motion estimation processing unit 222 is configured to estimate the motion of each receptive field in the subsequent input relative to a corresponding prior position in the key frame. As discussed earlier in the description of FIG. 3, the generated vector field may be used by the AI accelerator 220 to determine if the subsequent frame should be designated as key frame. Also, as earlier discussed, if the AI accelerator 220 determines that the subsequent input frame should not be designated as a key frame, the generated vector field may be sent to the interpolation processing unit 223. Although the method for estimating motion between image frames 600 can be performed by the motion estimation processing unit 222 for use within the AI system 200, the method for estimating motion between image frames 600 can be implemented as a useful method for estimating motion between various types of spatially arranged data sets, such as geographic information system data sets, imaging radar datasets, and the displacement between pixels within two images that are not necessarily associated with a video stream (e.g., computer generated graphics, real-time medical imaging data, etc.).

Figure 7:
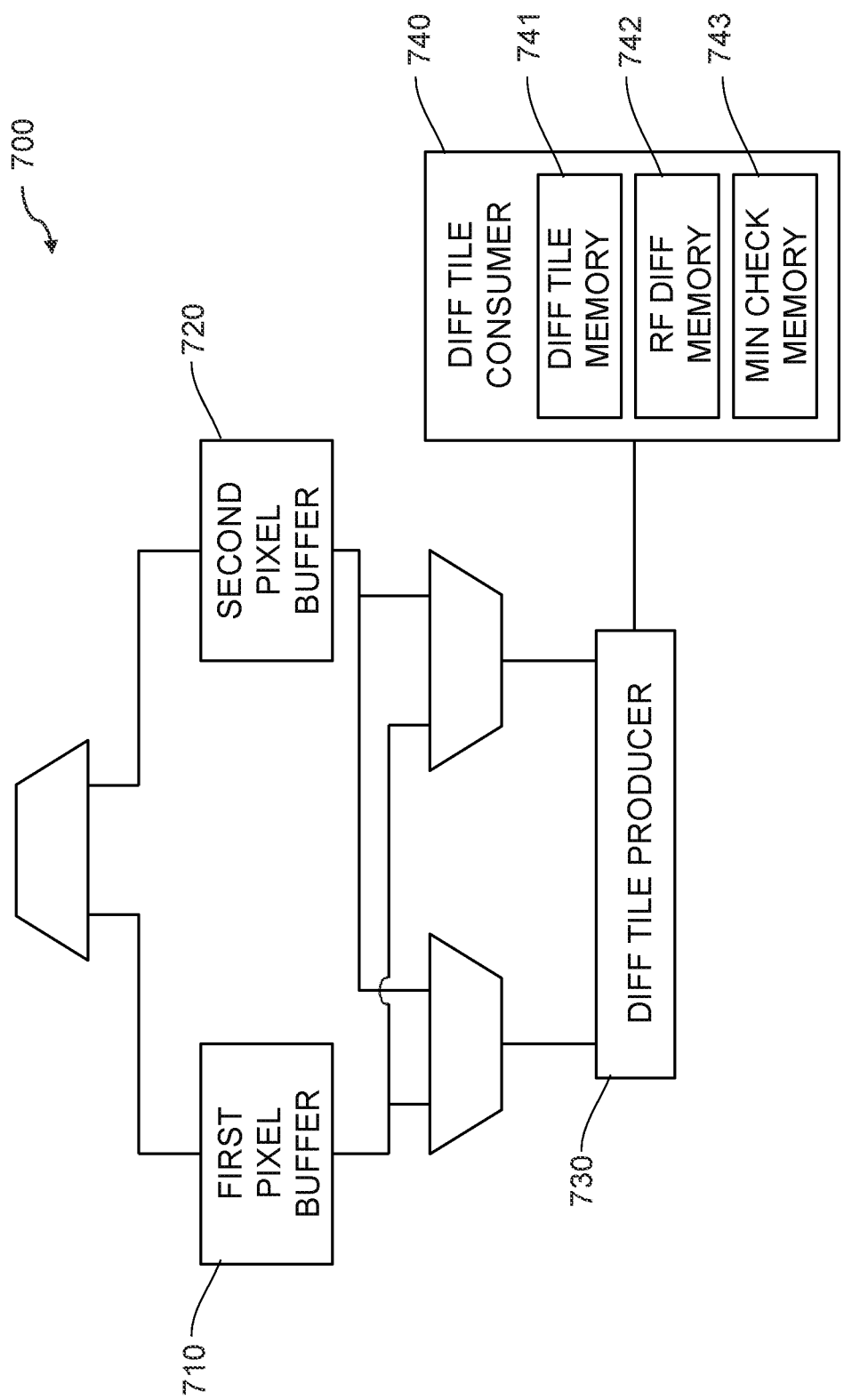
FIG. 7 is an illustrative example depicting logic for estimating motion between image frames according to exemplary implementations of the present disclosure.

As earlier discussed, using receptive fields to estimate the motion between image frames may allow for a reduction in processing power by exploiting the overlap between receptive fields. Because adjacent receptive fields overlap, there exits opportunities to implement logic that reuses APDs computed for one receptive field, to compute SAPDs for adjacent overlapping receptive fields. FIG. 7 is an illustrative example depicting logic for estimating motion between image frames 700 according to exemplary implementations of the present disclosure. The logic for estimating motion between image frames 700 may be referred to as Receptive Field Block Motion Estimation (RFBME). In some implementations, the logic for estimating motion between image frames 700 is included within the motion estimation processing unit 222 of FIG. 2. However, although RFBME can be performed by the motion estimation processing unit 222 for use within the AI system 200, RFBME can be implemented as a useful method for estimating motion between various types of spatially arranged data for wholly different purposes. That is, estimated receptive field motion information can be used in a wide variety of contexts without necessarily being used to translate activation values between image frames to accelerate neural network processing of such images. For example, RFBME can be applied to image data (or other spatially arranged data) processed by a neural network to generate receptive field activations where the activation values indicate the estimated movement of the pixels making up the receptive field. Similarly, RFBME can be used to determine overall metrics associated with motion between input frames, e.g., average motion metrics, maximum motion metrics, minimum motion metrics, etc.

The logic for estimating the motion between image frames 700 includes a first pixel buffer 710, a second pixel buffer 720, a difference (diff) tile producer 730, and a diff tile consumer 740. The first pixel buffer 710 and the second pixel buffer 720 are pixel buffers known in the art configured to store pixel data. The diff tile producer 730 can be an ASIC configured to compute difference metrics. In some implementations, the diff tile producer 730 includes an FPGA or computer executable code executed on a general purpose processor. The diff tile consumer 740 includes a diff tile memory 741, a Receptive Field (RF) diff memory 742, and a min check memory 743. The diff tile consumer 740 can be an ASIC configured to perform summation operations. In some implementations, the diff tile consumer 740 includes an FPGA or computer executable code executed on a general purpose processor.

The first pixel buffer 710 and the second pixel buffer 720 are configured to receive input frames. For example, the first pixel buffer 710 may receive a first input frame, which has been designated as a key frame, while the second pixel buffer 720 may receive a subsequent input frame. The subsequent input frame may later itself be designated as a key frame, in which case the next input frame may be stored in the pixel buffer storing the previous key frame. As indicated earlier, the input frames are divided into overlapping receptive fields. The first plurality of overlapping receptive fields may overlap similar to the receptive fields of FIG. 4C. That is, the adjacent receptive fields of the first plurality of overlapping receptive fields are offset from one another by a stride value S. The receptive fields of the first plurality of overlapping receptive fields include a block of pixels having at least 2S pixels in a first dimension and at least 2S pixels in a second orthogonal dimension to form an at least 2S-by-at-least-2S block of pixels. Also, in this implementation, the pixels within both input frames are further grouped into S-by-S tiles. Thus, if adjacent receptive fields in the input frames are offset by a stride of two, each pixel tile will include a two-by-two array of pixels.

The diff tile producer 730 is configured to receive the pixel tiles of the of the subsequent input frame and compare each pixel tile within the subsequent input frame with a number of potential prior locations for the pixel tile in the first input frame. For each pixel tile, the diff tile producer 730 calculates a sum of absolute pixel differences (or other pixel difference metric) between the pixel tile of the subsequent input frame and a number of potential prior locations in the first input frame. For illustrative purposes, an absolute pixel difference between a pixel tile and a potential prior location will be referred to as a "tile difference." As discussed earlier, the diff tile producer 730 may also calculate the L-1 normalized absolute pixel difference or other aggregate pixel difference metric. In some implementations, the diff tile producer 730 does not calculate tile differences for any zero padded regions of the receptive fields. In some implementations, the diff tile producer 730 receives the pixel tiles of the subsequent input frame row-by-row as they are positioned on a pixel tile array. In some implementations, the diff tile producer 730 receives the pixel tiles of the subsequent input frame column-by-column, as they are positioned on the pixel tile array. The number of potential prior locations in the first input frame is based on one or more search parameters. In some implementations, the search parameter includes a search radius. In some implementations, the search parameter includes a search stride. In some implementations, the search parameter includes a search radius and a search stride.

Figure 8:
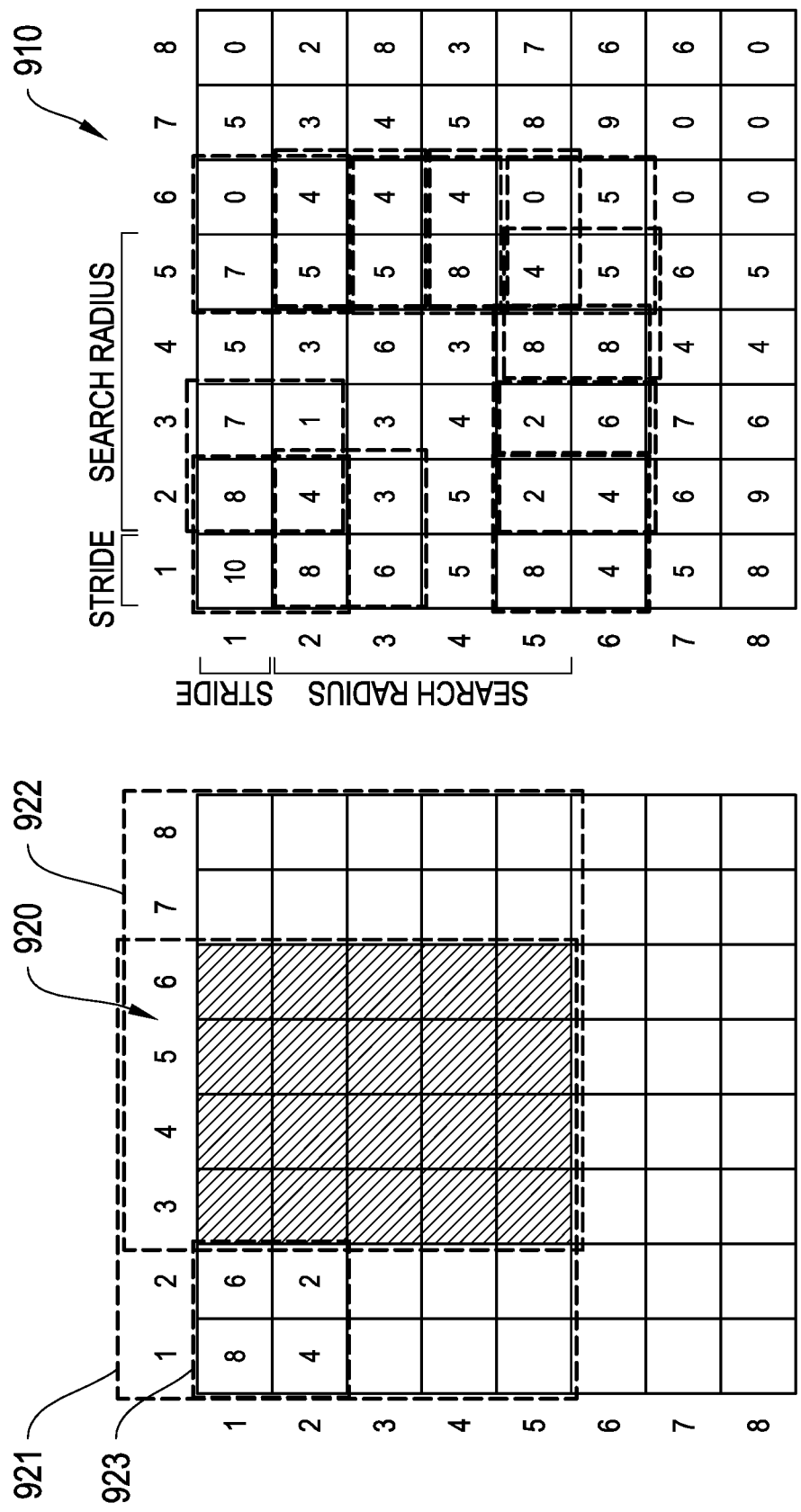
FIG. 8 is an illustrative example depicting the operation of a diff tile producer calculating tile differences according to exemplary implementations of the present disclosure.

FIG. 8 is an illustrative example depicting the operation of the diff tile producer 730 calculating tile differences according to exemplary implementations of the present disclosure. Referring to FIG. 8, a first input frame 910 is shown. The first input frame 910 includes an eight-by-eight array of pixels. A second input frame 920 is also shown and also includes an eight-by-eight array of pixels. The rows and columns of the pixel arrays from the first input frame 910 and the second input frame 920 are numbered for illustrative purposes. Also, for illustrative purposes, the pixels will be referred to by their positioning within the pixel array, similar to the pixels of FIGS. 4A-4C except that the labels are not shown. Thus, for example, the pixel located at the top left corner of the second input frame, or row 1 and column 1, may be referred to as pixel tile (1,1). Similarly, the pixel located at the bottom left corner of the second input frame, or row 8 and column 1, may be referred to as pixel tile (8,1). The first input frame 910 and the second input frame 920 can be the first input frame and the subsequent input frame respectively, as described in the previous discussion regarding FIG. 7. Thus, the first input frame 910 can be a key frame. Two receptive fields corresponding to the second input frame 920, a first receptive field 921 and a second receptive field 922, are shown for illustrative purposes. However, the second input frame 920, as well as the first input frame 910, can have many additional overlapping receptive fields. The first receptive field 921 and the second receptive field 922 are zero-padded according to techniques known in the art previously discussed. The first receptive field includes a first pixel tile 923.

The first pixel tile 923 includes pixels (1,1), (1,2), (2,1) and (2,2). The first pixel tile 923 is the pixel tile for which the diff tile producer is computing tile differences. For illustrative purposes, only one pixel tile in the second input frame 920 is highlighted, however the other pixels within the first receptive field 921, as well as the second receptive field 922, are also grouped into pixel tiles having the same dimensions as the first pixel tile 923. When the diff tile producer 730 receives the first pixel tile 923 of the second input frame 920, it calculates tile differences for the first pixel tile 923 in the subsequent input frame 920 relative to a number of potential prior locations in the first input frame 910, indicated by the dashed-line squares. The number of potential prior locations chosen represents potential prior locations in the first input frame 910 for the first pixel tile 923 in the second input frame 920. The numbers positioned in the center of the pixels within the potential prior locations in the first input frame 910 represent the pixel intensity values of the pixels located within the potential prior locations.

Figure 9A:
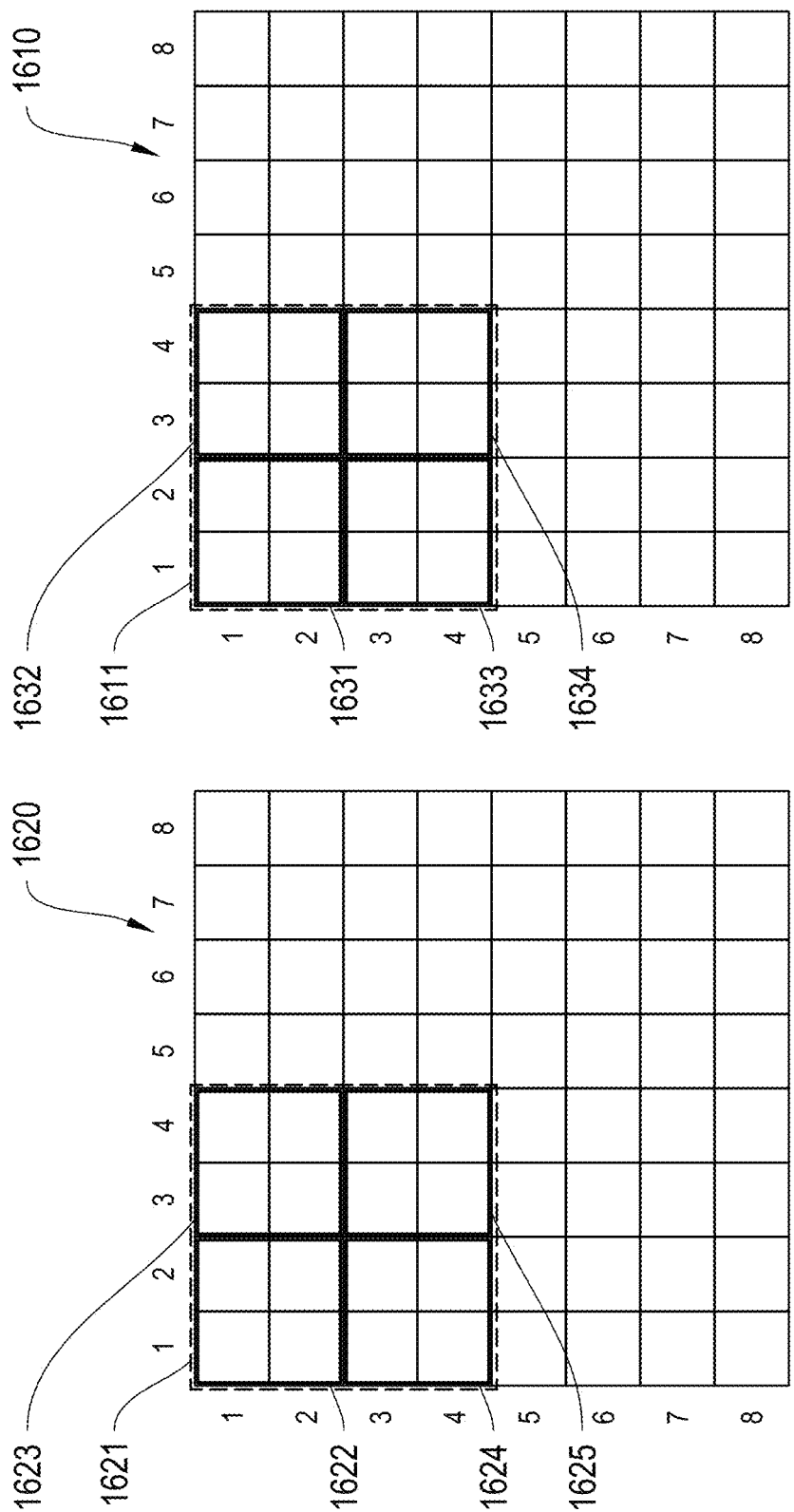
FIGS. 9A and 9B are an illustrative example of a diff tile consumer identifying potential prior locations for the entirety of a receptive field according to exemplary implementations of the present disclosure.
Figure 9B:
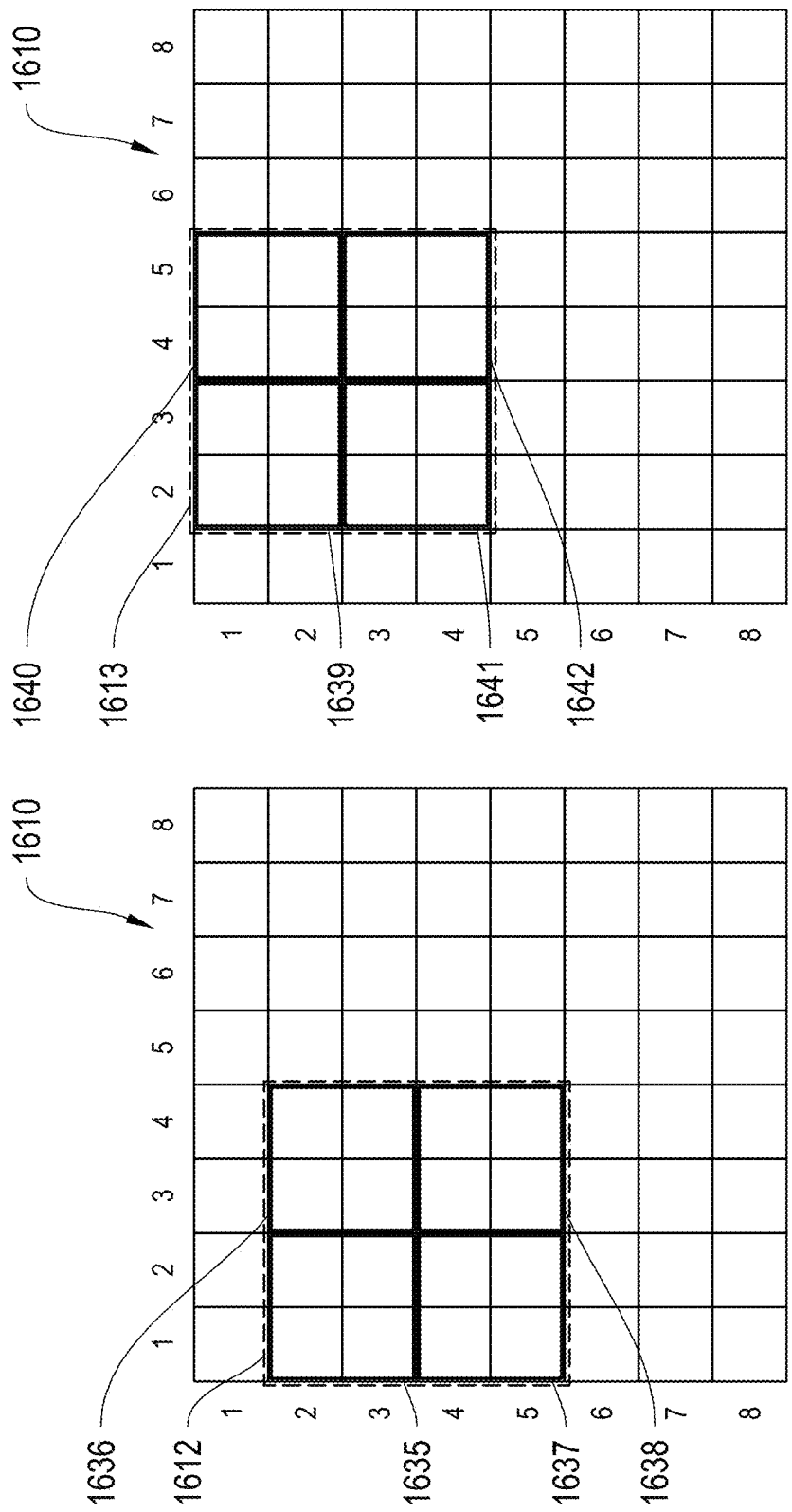

The potential prior locations chosen in the first input frame 910 are based on one or more search parameters. As indicated above, the search parameter may include a search radius and a search stride. For example, the search radius shown in FIGS. 9A and 9B is a search radius of four because the diff tile producer is considering the potential prior location associated with the current position of the first pixel tile 923 in the first input frame 910, as well as the potential prior locations located within a four pixel radius from the potential prior location associated with the current position. However the potential prior locations in the first input frame 910 within the four pixel search radius that would be located in the zero-padded region above the potential prior location corresponding to the current position are not included in the tile difference computations. The search stride shown is one because the diff tile producer 730 is comparing all potential prior locations from the potential prior location associated with the current position to the outer bounds of the search radius at increments of one pixel. If, however, the search stride was a value of two, the diff tile producer 730 may consider every other potential prior location in the first input frame 910 within the four pixel radius for tile difference computations. For illustrative purposes, not all potential prior locations between the current position and the outer bounds of the search radius are shown. The search parameters may be chosen based on a desired accuracy regarding estimating the motion between image frames. A higher search radius and/or a lower search stride may lead to more accurate motion estimation. A lower search radius and/or a higher search stride may lead to less accurate motion estimation. For example, a search parameter that includes a search radius of 50 with a search stride of 16 would mean that the diff tile producer 730 would compare each pixel tile with the potential prior locations along the 50 pixel tile radius at 16 pixel increments. Therefore, depending on the size of the pixel tile, the diff tile producer may skip over multiple pixel groups and thus may not find the best matching potential prior location, or as described earlier, a tile sized grouping of pixels that would generated the minimum tile difference. In some implementations, the search stride is less than the receptive field stride, and the search radius is less than three times the size of a receptive field. In some implementations the search parameters are selected based on the predicted motion behavior of the pixels within the frames of an input video stream, for example using various parameter optimization processes, e.g., a random search process.

Referring back to FIG. 7, the diff tile producer 730 performs these calculations for each pixel tile in the subsequent input frame. The diff tile producer 730 then sends the tile differences calculated for each tile in the subsequent input frame to the diff tile consumer 740. The diff tile consumer 740 stores the incoming tile differences in the diff tile memory 741 and buffers the incoming tile differences until it receives all the tile differences corresponding to all potential prior locations of a first receptive field in the subsequent input frame. For example, referring back to FIG. 8, the diff tile consumer 740 will buffer the income tile differences until it has received all tile differences corresponding to every pixel tile within the first receptive field 921. Referring back to FIG. 7, because all the tile differences computed for each pixel tile in the first receptive field are received by the diff tile consumer 740, the diff tile consumer 740 can identify potential prior locations for the entirety of the first receptive field.

For example, FIGS. 9A and 9B are an illustrative example of the diff tile consumer 740 identifying potential prior locations for the entirety of a receptive field according to exemplary implementations of the present disclosure. Referring to FIGS. 9A and 9B, a first input frame 1610, which has been designated as a key frame, and a subsequent input frame 1620 are shown. Both the first input frame 1610 and the subsequent input frame 1620 include an eight-by-eight array of pixels. As per earlier discussions, the rows and columns of the pixel arrays have been numbered and the pixels will be referred to by their positioning within the pixel array. The dashed-line box within the subsequent input frame 1620 represents a receptive field 1621 for which the diff tile consumer 740 has received all calculated tile differences from the diff tile producer 730. The receptive field 1621 further includes a first pixel tile 1622, a second pixel tile 1623, a third pixel tile 1624 and a fourth pixel tile 1625. The pixel tiles within the receptive field 1621 include a group of four pixels each, two pixels in a first direction and two pixels in a second orthogonal direction. For example, the first pixel tile 1622 includes pixels (1,1), (1,2), (2,1) and (2,2). The second pixel tile 1623 includes pixels (1,3), (1,4), (2,3) and (2,4).

The dashed-line boxes within the first input frame 1610 represent a first potential prior location 1611, a second potential prior location 1612, and a third potential prior location 1613 in the first input frame 1610 for the receptive field 1621 in the subsequent input frame 1620. Each potential prior location in the first input frame 1610 also include four groups of pixels. For example, the first potential prior location 1611 includes a first pixel group 1631, a second pixel group 1632, a third pixel group 1633, and a fourth pixel group 1634. The second potential prior location 1612 includes a fifth pixel group 1635, a sixth pixel group 1636, a seventh pixel group 1637, and an eighth pixel group 1638. The third potential prior location includes a ninth pixel group 1639, a tenth pixel group 1640, an eleventh pixel group 1641, and a twelfth pixel group 1642.

The pixel groups are the same dimensions of the pixel tiles and thus each pixel group includes four pixels. For example, the first pixel group 1631 includes pixels (1,1), (1,2), (2,1) and (2,2) in the first input frame 1610. The fifth pixel group 1635 includes pixels (2,1), (2,2), (3,1), and (3,2) in the first input frame 1610. The pixel groups represent potential prior locations in the first input frame 1610 for the pixel tiles in the subsequent input frame 1620. For each potential prior location for the receptive field 1621, the diff tile producer 730 has calculated a tile difference between each pixel tile in the receptive field 1621 and a spatially corresponding pixel group in the potential prior location. For example, regarding the first potential prior location 1611, the diff tile producer 730 has calculated a tile difference between each pixel tile in the receptive field 1621 and a spatially corresponding pixel group in the first potential prior location 1611. That is, a tile difference has been calculated by the diff tile producer 730 between: the first pixel group 1631 in the first input frame 1610 and the first pixel tile 1622 of the subsequent input frame 1620; the second pixel group 1632 in the first input frame 1610 and the second pixel tile 1623 in the subsequent input frame 1620; the third pixel group 1633 in the first input frame 1610 and the third pixel tile 1624 in the subsequent input frame 1620; and the fourth pixel group 1634 in the first input frame 1610 and the fourth pixel tile 1625 in the subsequent input frame 1620.

Regarding the second potential prior location 1612, the diff tile producer 730 has calculated a tile difference between: the fifth pixel group 1635 of the first input frame 1610 and the first pixel tile 1622 of the subsequent input frame 1620; the sixth pixel group 1636 of the first input frame 1610 and the second pixel tile 1623 in the subsequent input frame 1620; the seventh pixel group 1637 in the first input frame 1610 and the third pixel tile 1624 in the subsequent input frame 1620; and the eighth pixel group 1638 in the first input frame 1610 and the fourth pixel tile 1625 in the subsequent input frame 1620. Regarding the third potential prior location 1613, the diff tile producer 730 has calculated a tile difference between: the ninth pixel group 1639 of the first input frame 1610 and the first pixel tile 1622 of the subsequent input frame 1620; the tenth pixel group 1640 of the first input frame 1610 and the second pixel tile 1623 in the subsequent input frame 1620; the eleventh pixel group 1641 in the first input frame 1610 and the third pixel tile 1624 in the subsequent input frame 1620; and the twelfth pixel group 1642 in the first input frame 1610 and the fourth pixel tile 1625 in the subsequent input frame 1620. For illustrative purposes, only three potential prior locations for the receptive field 1621 are shown however the receptive field 1621 can have several more potential prior locations based on the search stride and search radius used by the diff tile producer 730. For each potential prior location, the diff tile consumer 740 calculates the sum of absolute tile differences, which would also be equal to the SAPD. The sum of absolute tile difference will be referred to herein as a "receptive field difference." The receptive field difference with the lowest value is the minimum receptive field difference.

Referring back to FIG. 7, the diff tile consumer 740 stores the receptive field differences between the first receptive field and each potential prior location, in the RF Diff Memory 742. As the diff tile consumer 740 compares the various potential prior locations of a given receptive field, it stores the currently lowest receptive field difference and its corresponding offset in the min check memory 743. The corresponding offset refers to the distance between the current location of the receptive field in the subsequent image frame and the potential prior location in the first input frame. For example, referring back to FIGS. 9A and 9B, the offset between the receptive field 1621 and the second potential prior location 1612 is one in the vertical direction because the second potential prior location is offset from the current position of the receptive field 1621 by a distance of one pixel in the vertical direction.

As each new prior location is assessed, its corresponding receptive field difference is compared to the stored receptive field difference in the min check memory 743. If a new receptive field difference is lower, then the values in the min check memory 743 are updated. Otherwise, the values in the min check memory 743 remain unchanged. The finally selected offset for a given receptive field is the offset stored in the min check memory 743 after all potential prior locations have been evaluated. This process allows the comparison process to occur in parallel with the computations of additional receptive field differences for other potential prior locations.

The diff tile consumer 740 then receives the tile differences corresponding to the pixel tiles of a subsequent overlapping receptive field of the subsequent image frame. The subsequent receptive field overlaps with the first receptive field such that the subsequent receptive field shares a portion of pixel tiles with the first receptive field and includes additional pixel tiles. Consequently, the first receptive field includes the shared portion of pixel tiles and an unshared portion or pixel tiles. For example, referring back to FIG. 8, assume that the first receptive field is the first receptive field 921, and the subsequent receptive field is the second receptive field 922 for illustrative purposes. Also assume that the other pixels in the pixel array of the second receptive field 922 are also grouped into pixel tiles similar to the first pixel tile 923. The receptive fields share the pixel tiles that include the pixels shown with the diagonal line crosshatch. The first receptive field also includes the unshared pixel tiles positioned to the left of the shaded pixel tiles. The second receptive field 922 further includes the additional pixel tiles positioned to the right of the shaded pixel tiles. Referring back to FIG. 7, the diff tile consumer 740 only receives the tile differences corresponding to the additional pixel tiles of the subsequent receptive field. Once the additional tile differences are received, the diff tile consumer 740 retrieves the receptive field differences of the first receptive field, subtracts the tile differences associated with the unshared portion of pixel tiles within the first receptive field, and adds the tile differences associated with the additional pixel tiles within the subsequent receptive field. Using this information, the diff tile consumer 740 may now evaluate potential prior locations for the subsequent receptive field in the first input frame.

For each of the potential prior locations of the subsequent receptive field, the diff tile consumer 740 computes the receptive field differences and stores them into the RF diff memory 742. The diff tile consumer 740 also stores the receptive field differences, and their associated offsets, in the min check memory 743 according to the process applied to the receptive field differences for the first receptive field, until the minimum receptive field difference for the subsequent receptive field, and its associated offset, are stored in the min check memory 743. Thus, a minimum receptive field difference for the first receptive field and a minimum receptive field difference for the subsequent receptive field are now stored in the min check memory 743, along with their associated offsets.

The diff tile consumer 740 computes receptive field difference for later receptive fields in a similar manner until it computes receptive field differences corresponding to all receptive fields in the subsequent input frame. That is, the diff tile consumer 740 computes receptive field differences for later receptive fields by retrieving the receptive field differences corresponding to a previous overlapping receptive field, subtracting the tile differences corresponding to the unshared pixel tile portion of the previous receptive field, and adding the tile differences corresponding to the additional pixel tiles to the result of the subtraction. For each later receptive field, the diff tile consumer 740 stores the receptive field differences in the RF diff memory 742 and stores minimum receptive field difference, as well as their associated offsets, in the min check memory 743, as per the process described earlier.

The minimum receptive field difference offsets define vectors describing the motion of the receptive fields between input frames. The totality of these vectors defines a vector field. As discussed earlier, the AI accelerator 220 of FIG. 2 can use the vector field to determine if the subsequent input frame should be designated as a key frame. If the AI accelerator does determine that the subsequent input frame is a key frame, the subsequent frame will remain stored in its current pixel buffer, and the other pixel buffer will receive a later input frame, wherein the later input frame will replace the original key frame in the other pixel buffer. Thus, diff tile producer 730 will estimate the motion of the pixel tiles in the later input frame relative to potential prior locations in the subsequent input frame, which is now designated as the key frame. Consequently, the diff tile producer 730 may always use a key frame as the reference frame for evaluating motion in later input frames.

If the AI accelerator 220 does not designate the subsequent input frame as a key frame, the diff tile consumer 740 may send the vector field to an interpolation processing unit, such as the interpolation processing unit 223 of FIG. 2.

Figure 10:
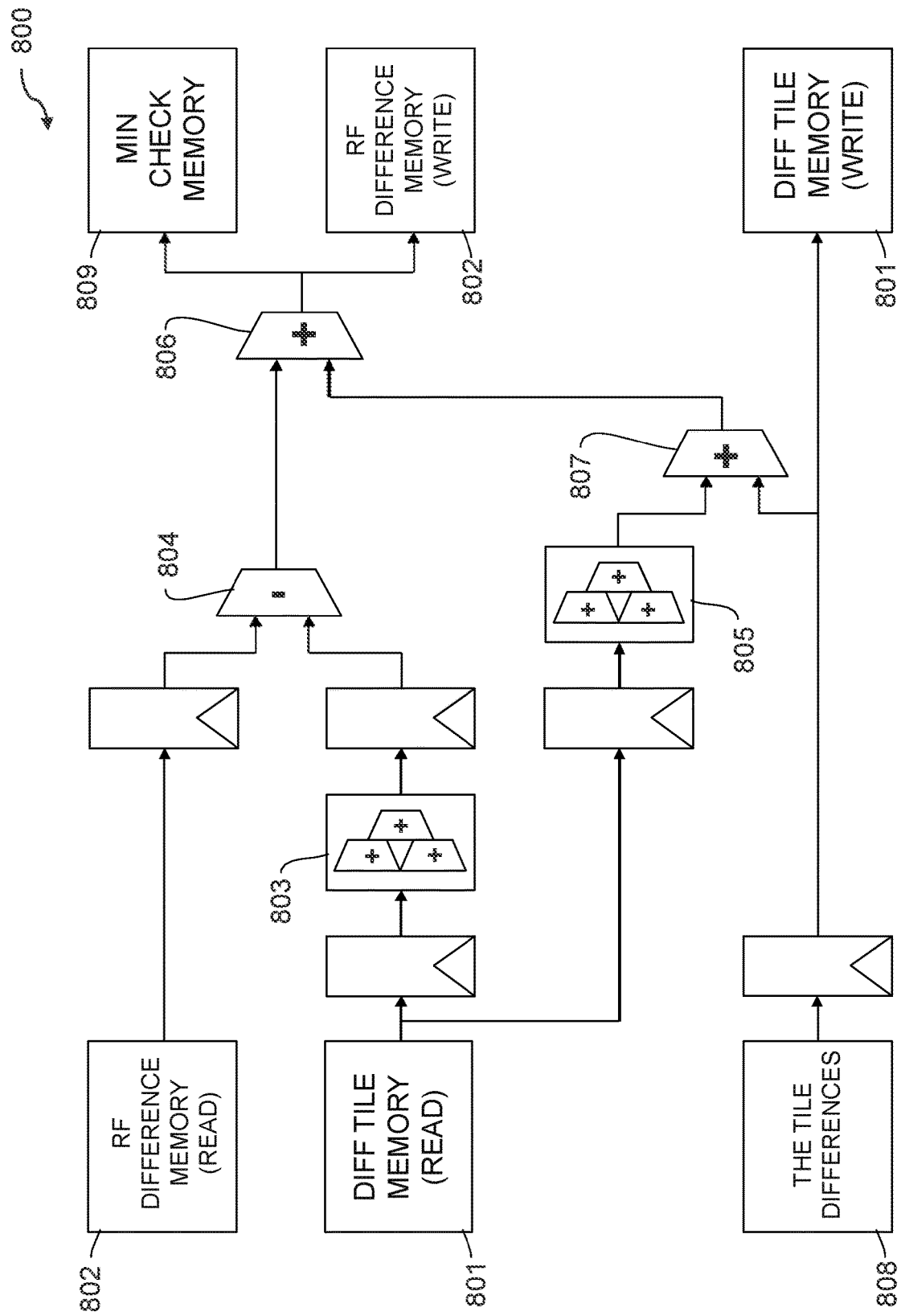
FIG. 10 is flow diagram depicting a diff tile consumer as implemented in logic for estimating motion between image frames according to exemplary implementations of the present disclosure.

FIG. 10 is flow diagram depicting a diff tile consumer 800 as implemented in the logic for estimating motion between image frames 700 according to exemplary implementations of the present disclosure. In some implementations, the diff tile consumer 800 is the diff tile consumer 740 of FIG. 7. The diff tile consumer 800 is configured to receive the tile differences corresponding to the subsequent input frame described earlier. The diff tile consumer 800 includes a diff tile memory 801, a RF diff memory 802, a min check memory 809, a first arithmetic logic unit (ALU) 804, a second ALU 806, a third ALU 807, a first adder tree 803, and a second adder tree 805. In some implementations, the diff tile memory 801 is the diff tile memory 741 of FIG. 7. In some implementations, the RF diff memory 802 is the RF diff memory 742 of FIG. 7. In some implementations, the min check memory 809 is the min check memory 743 of FIG. 7. In some implementations, the ALUs are ALUs known in the art, which are included in computing circuits and configured to perform arithmetic operations. In some implementations, the adder trees are adder trees known in the art which include numerous ALUs configured to compute the sum of multiple numbers. The second ALU 806 and the third ALU 807 are both configured to perform addition. The first ALU 804 is configured to perform subtraction. The diff tile consumer 800 is configured to receive the tile differences 808 and store the tile differences in the diff tile memory 801.

For incoming tile differences, the diff tile consumer 800 causes the third ALU 807 and the second adder tree 805 to sum the tile differences corresponding to each potential prior location of a first receptive until it computes a receptive field difference between the first receptive field and each potential prior location. As the diff tile consumer 800 computes each receptive field difference, the diff tile consumer 800 stores each receptive field difference in the RF diff memory 802. The diff tile consumer 800 also stores the minimum receptive field difference associated with the current receptive field, along with its associated offset, in the min check memory 809, as per the processes described earlier.

To compute each receptive field difference for a subsequent overlapping receptive field, the diff tile consumer 800 first causes the second adder tree 805 and the third ALU 807 to sum the tile differences corresponding to the additional pixel tiles of the subsequent receptive field. The diff tile consumer 800 then retrieves the tile differences corresponding to the unshared portion of tiles in the previous receptive field from the diff tile memory 801 and causes the first adder tree 803 to sum these tile differences. The diff tile consumer 800 then retrieves the receptive field differences associated with the previous receptive field from the RF diff memory 802 and causes the first ALU 804 to subtract the sum of the tile differences associated with the unshared pixel tiles from the receptive field differences associated with the previous receptive field. The diff tile consumer 800 then causes the second ALU 806 to add the sum of the tile differences associated with the additional pixel tiles to the result of the subtraction performed by the first ALU 804 to obtain receptive field differences for the subsequent receptive field for each potential prior location, which are stored in the RF difference memory 802. The diff tile consumer also stores the minimum receptive field difference associated with the subsequent receptive field, as well as its associated offset, in the min check memory 809 as per the process discussed earlier. The diff tile consumer 800 repeats this process until minimum receptive field differences associated with all receptive fields in the subsequent input frame, and their associated offsets, are stored in the min check memory 809. As discussed earlier, once all minimum receptive differences are stored, the diff tile consumer 800 may send a vector field representing all of the minimum receptive field difference offsets to an interpolation processing unit, such as the interpolation processing unit 223 of FIG. 2.

As indicated above, once the motion estimation processing unit 222 generates the vector field, it may send the vector field to the interpolation processing unit 223 if the subsequent input frame is not to be designated as a key frame.

Also, as indicated above, the interpolation processing unit 223 is configured to process the stored first prefix output based on the vector field obtained while performing motion estimation (step 308 of the method for performing image analysis 300). The AI accelerator 220 applies the vector field to the first prefix output and translates the activations within the first prefix output according to the vector field to obtain a first predicted output.

Figure 11A:
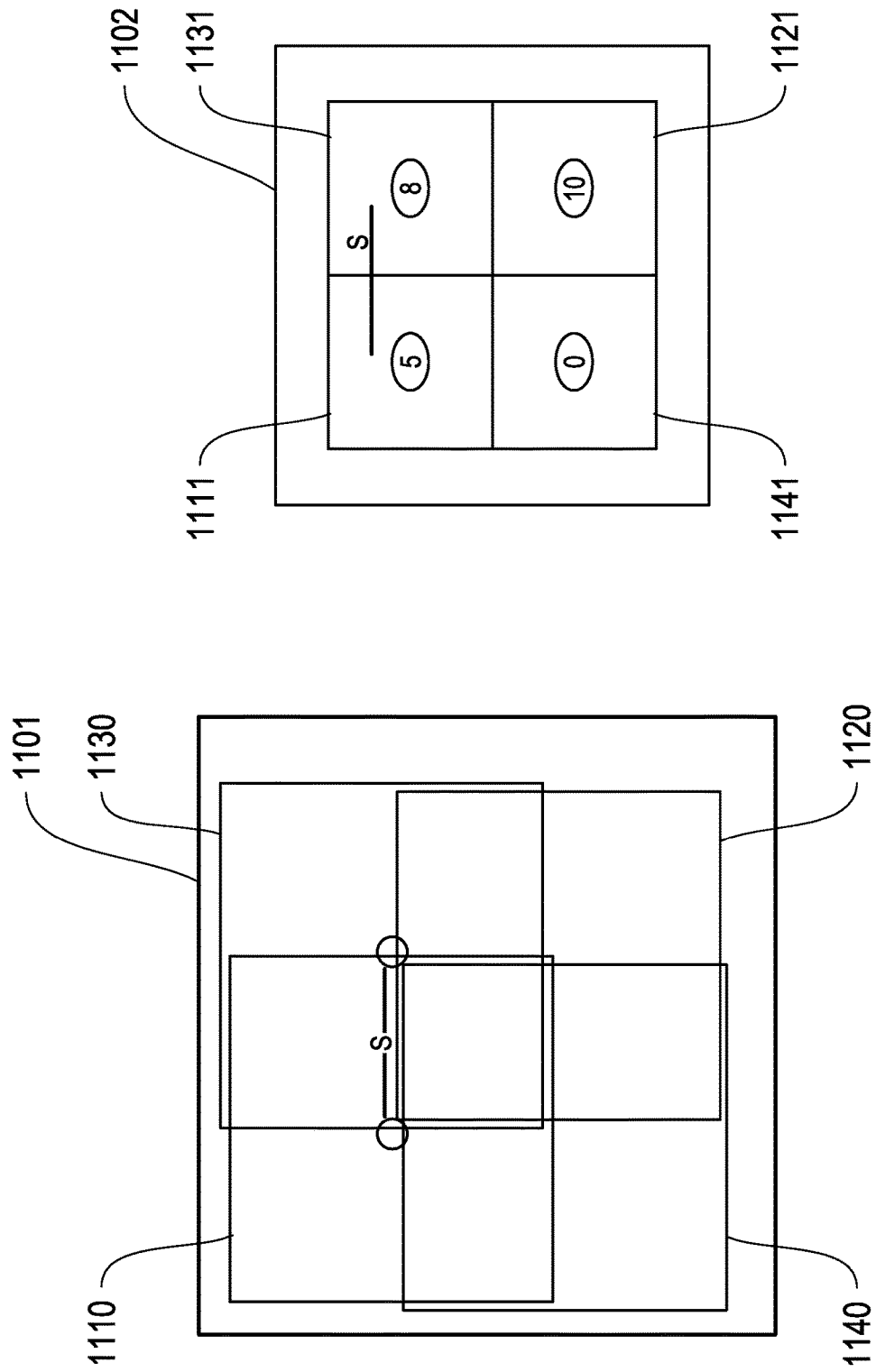
FIG. 11A is an illustrative example depicting a first input frame (key frame) and its corresponding neural network output according to exemplary implementations of the present disclosure.
Figure 11B:
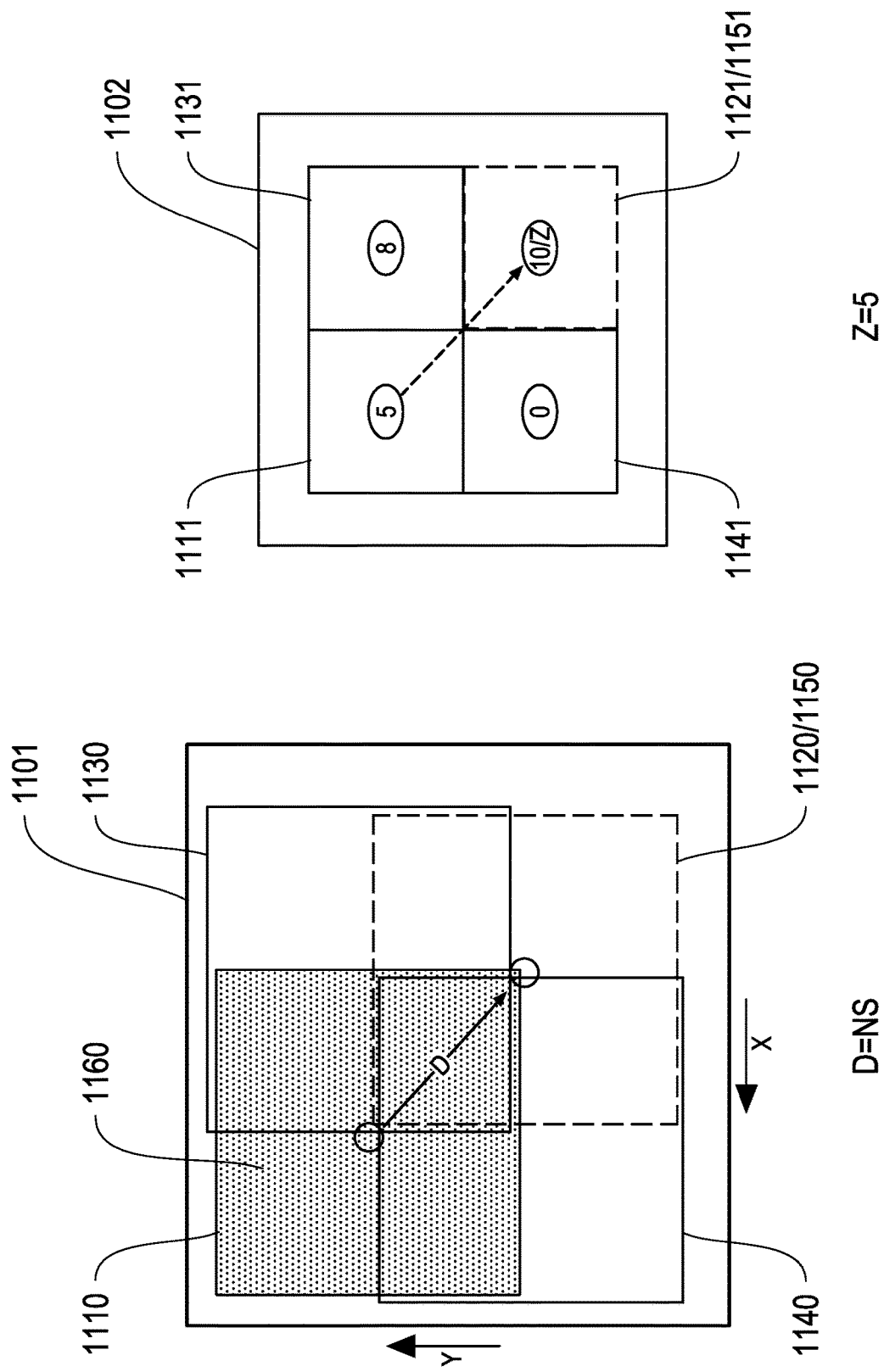
FIG. 11B is an illustrative example depicting an interpolation processing unit generating a predicted activation based on the motion of a receptive field in a subsequent input frame relative to its prior location in a first input frame, according to exemplary implementations of the present disclosure.

As earlier indicated, the first prefix output may contain a plurality of spatially arranged activations and the first predicted output may contain a plurality of spatially arranged predicted activations. FIG. 11A is an illustrative example depicting a first input frame (key frame) 1101 and its corresponding first neural network output 1102 according to exemplary implementations of the present disclosure. FIG. 11B is an illustrative example depicting the interpolation processing unit 223 generating a predicted activation based on the motion of a receptive field in a subsequent input frame relative to its prior location in a first input frame, according to exemplary implementations of the present disclosure.

Referring to FIG. 11A, a first input frame 1101 and a first neural network output 1102 are shown. The first input frame 1101 includes a first receptive field 1110, a second receptive field 1120, a third receptive field 1130 and a fourth receptive field 1140. The receptive fields are offset by a stride S. For example, the line indicated with the letter S is the offset stride between the first receptive field 1110 and the third receptive field 1130. The first neural network output 1102 includes a first activation 1111, a second activation 1121, a third activation 1131, and a fourth activation 1141. The activations correspond to a single channel of output data for the receptive fields in the first input frame 1101. That is, the first activation 1111 corresponds with a channel of output for the first receptive field 1110, the second activation 1121 corresponds with a channel of output for the second receptive field 1120, the third activation 1131 corresponds with a channel of out put the third receptive field 1130, and the fourth activation 1141 corresponds with a channel of output for the fourth receptive field 1140. The numbers within the activations show the activation value of the activation. For example, the activation value of the first activation 1111 is 5 and the activation value of the second activation 1121 is 10. While only one channel of activations is shown, each receptive field associated with a given CNN layer may have tens, hundreds, thousands or potentially even more channels.

In typical CNN applications, the activation values corresponding to a receptive field are spaced from one another by the stride S as shown in FIG. 11A. The activations may be spaced by stride S in either the horizontal or vertical dimension.

Referring to FIG. 11B the first input frame 1101 and its associated receptive fields are shown. However, the second receptive field 1120 is indicated by a dashed line box. The dashed line box represents the position of the second receptive field 1120 in the first input frame 1101 and the position of a new receptive field 1150 in that subsequent input frame. Thus, the new receptive field 1150 is spatially aligned with the second receptive field 1120 but located within the subsequent input frame. A prior location 1160 is shown and indicated by a dot-filled box. The prior location 1160 is the prior location of the new receptive field 1150 in the first input frame 1101. The prior location 1160 is located at the same location as the first receptive field 1110. The arrow labeled with the letter D represents the offset vector between the new receptive field 1150 from the subsequent input frame and its prior location 1160 in the first input frame 1101, which was produced by the motion estimation processing unit 222. The offset is a multiple (n) of the stride in each of two dimensions, thus the prior location 1160 is substantially aligned with one of the receptive fields in the first input frame 1101. In this case, the offset is a multiple (n) of one in both the vertical and horizontal dimensions, because the new receptive field 1150 has moved the length of a stride in the x direction, and the length of a stride in the y direction, from its prior location 1160. Thus, it could be said that the prior location of the new receptive field 1150 is the location of the first receptive field 1110.

FIG. 11B also shows the activations corresponding to the receptive fields in the first input frame 1101. However, the second activation 1121 is indicated by a dashed-line box. The dashed-line box represents the position of the second activation 1121 and a predicted activation 1151 within a predicted neural network output. The predicted activation 1151 corresponds to the new receptive field 1150 and has a value of Z as shown. Because the prior location 1160 is the location of the first receptive field 1110 in the first input frame 1101, the interpolation processing unit 223 can use the vector to identify the activation corresponding with the first receptive field in the first neural network output 1102 and use this activation value to predict the activation 1151 that corresponds with the subsequent input frame's receptive field 1150. Thus, in this instance, the value (Z) of the predicted activation 1151 is 5.

Figure 11C:
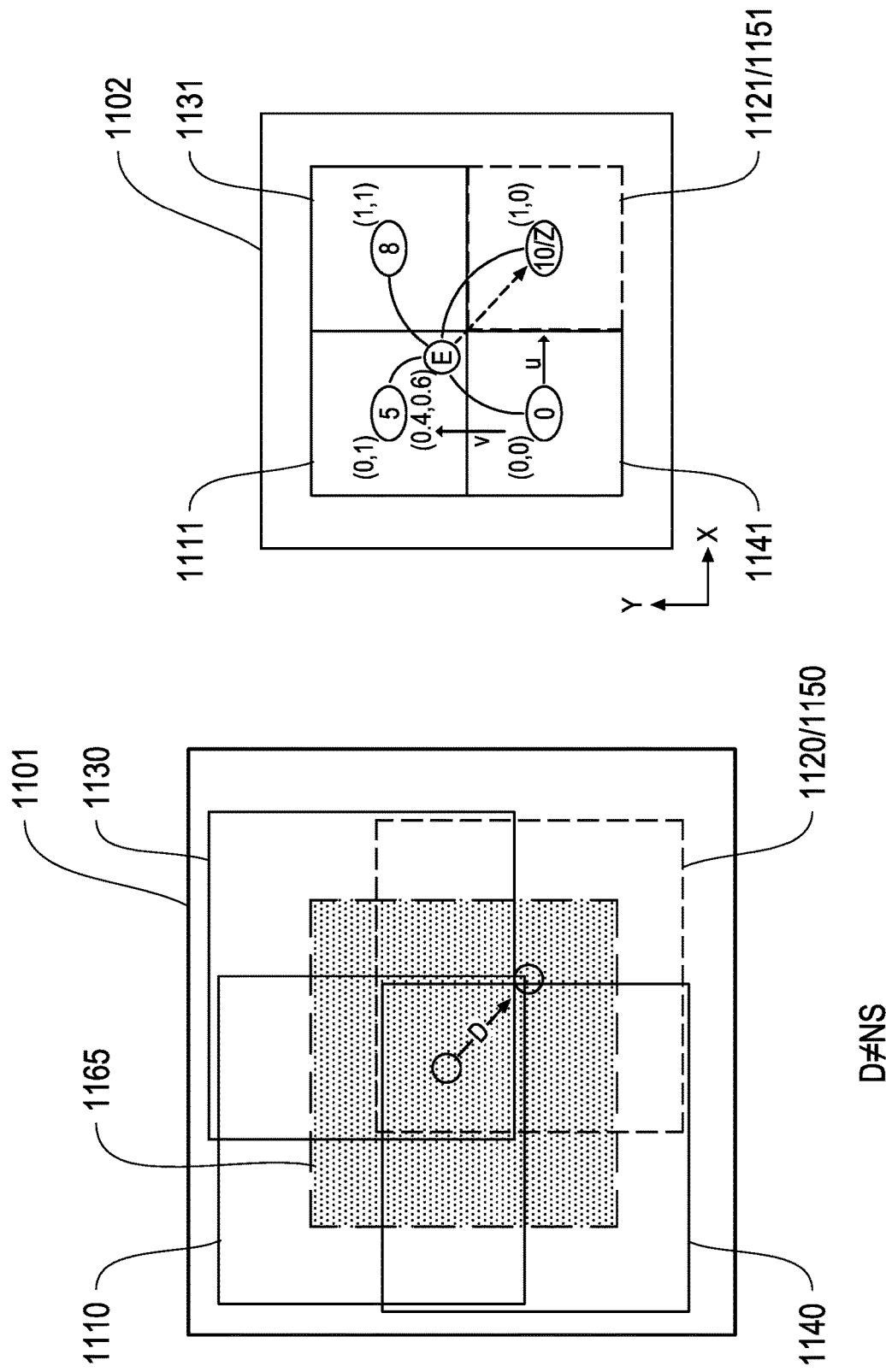
FIG. 11C is an illustrative example depicting an interpolation processing unit generating a predicted activation based on the motion of a receptive field in a subsequent input frame relative to its prior location in a first input frame, where the prior location is between receptive fields in the first input frame, according to exemplary implementations of the present disclosure.

The above example demonstrates translation in the instance where a receptive field in a subsequent input frame is determined to have a prior location that matches a location of a receptive field in the first input frame. In such cases, interpolation is not necessary. However, groups of pixels may not move a distance equal to an integer multiple of a receptive field stride(S) between image frames. FIG. 11C is an illustrative example depicting the interpolation processing unit 223 generating a predicted activation based on the motion of a receptive field in a subsequent input frame relative to its prior location in a first input frame where the prior location is between receptive fields of the first input frame, according to exemplary implementations of the present disclosure. Referring to FIG. 11C, when the prior location 1165 is between multiple receptive fields, the displacement vector D of a new receptive field 1150 in a subsequent image frame is not equal to a multiple (N) of the receptive field stride in the horizontal and/or vertical dimensions. Thus, the interpolation processing unit 223 may not be able to accurately predict the activation 1151 based on any single activation value in the first neural network output 1102. Consequently, as shown in FIG. 11C, the interpolation processing unit 223 may interpolate between the activations corresponding to the multiple receptive fields proximate to the prior location 1165 to increase its accuracy in predicting the activation value for the predicted activation 1151. Also, as discussed earlier, the AI accelerator 220 may store the neural network output by performing zero-gap run length encoding on the activations within the neural network output. However, this may cause complications in performing interpolation because the activations may be sent to the interpolation processing unit 223 one at a time. Thus, it may be desirable to implement logic within the interpolation processing unit 223 that facilitates interpolation when the activations have been zero-gap run length encoded.

Figure 12:
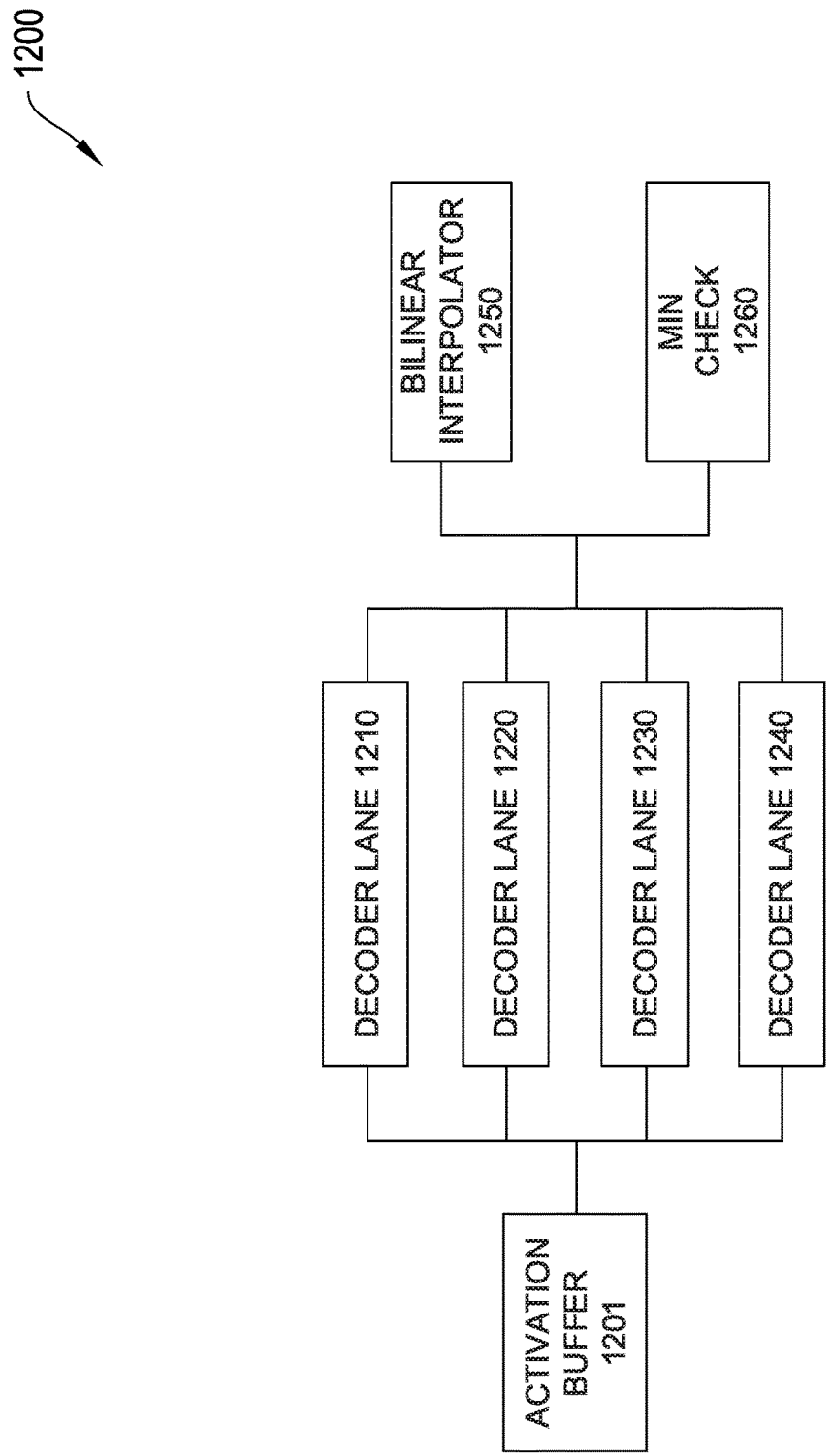
FIG. 12 is an illustrative example depicting logic for calculating predicted neural network outputs, which may be implemented within an interpolation processing unit, according to exemplary implementations of the present disclosure.

FIG. 12 is an illustrative example depicting logic for calculating predicted neural network outputs 1200, which may be implemented within the interpolation processing unit 223, according to exemplary implementations of the present disclosure. The logic for calculating predicted neural network outputs 1200 includes a first decoder lane 1210, a second decoder lane 1220, a third decoder lane 1230, and a fourth decoder lane 1240. The logic for calculating predicted neural network outputs 1200 further includes an activation buffer 1201, a bilinear interpolator 1250, and a min check logic 1260. The logic for calculating predicted neural network outputs 1200 represents processing logic and each component may be implemented as hardware, such as circuitry and dedicated logic, or software executed on the interpolation processing unit 223. As indicated above, the interpolation processing unit 223 is configured to obtain, for a given receptive field in a subsequent image frame (a "new receptive field"), the neural network activations corresponding to the channels of the receptive fields in a first input frame proximate to the estimated prior location of the new receptive field (the "surrounding receptive fields"). To that end, the activation buffer 1201 is configured to receive and store the neural network outputs corresponding to the channels of the surrounding receptive fields from the first input frame. The first decoder lane 1210, the second decoder lane 1220, the third decoder lane 1230 and the fourth decoder lane 1240 are configured to receive, from the activation buffer 1201, the neural network outputs corresponding to a respective receptive field of the surrounding receptive fields' channels. Depending on the size of the neural network, and number of layers, there may be tens, hundreds, or even thousands (or more) of channels for each receptive field.

As indicated earlier, the neural network outputs have been compressed by zero-gap run length encoding. Thus, the neural network outputs loaded into each decoder lane may contain zero gaps assigned to non-zero activations. The decoder lanes and the min check logic 1260 are configured to cooperate with one another to perform on-the-fly skip-zero decoding on the received neural network outputs, as later described in FIG. 13. As the neural network outputs are decoded, they are sent to the bilinear interpolator 1250. Consequently, the neural network outputs do not need to be fully decoded in advance of processing, thereby reducing processing time, energy consumption, and memory transfer and storage requirements. The bilinear interpolator 1250 is also configured to receive a displacement vector from the motion estimation processing unit 222, scale the vector to the dimensions of the neural network outputs by dividing the vector by the receptive field stride, and use the scaled vector to interpolate between the neural network outputs to generate predicted neural network outputs.

For example, referring back to FIG. 11C, to predict the activation 1151 for the receptive field 1150, the first activation 1111, the second activation 1121, the third activation 1131, and the fourth activation 1141 will be sent to the bilinear interpolator 1250 at once. The bilinear interpolator will interpolate, by performing bilinear interpolation, between the activation values based on the respective distances between the start point of the scaled vector associated with the estimated motion of the new receptive field 1150 (which is indicated in FIG. 11C by the symbol (E) and the locations in the "activation space" (described further below) of the first through fourth activation values 1111, 1121, 1131, and 1141. The interpolation results in a predicted value (z) for the predicted activation 1151. For example, assume the positions of the activations are defined as pairs of x and y coordinates (x,y), wherein the x coordinate is located on an x-axis along a horizontal direction and the y coordinate is located on a y-axis along a vertical direction, as shown in FIG. 11C. Because the vector has been scaled to the dimensions of the activations, the x and y coordinates describing the position of an activation value will either be one or zero.

Thus, the first activation's 1111 positional coordinates are (0,1), the second activation's 1121 positional coordinates are (1,0), the third activation's 1131 positional coordinates are (1,1), and the fourth activation's 1141 positional coordinates are (0,0). The start point (E) of the scaled vector has positional coordinates (0.4, 0.6). The specific positional coordinates assigned to the activations of FIG. 11C are for illustrative purposes and the activations can be assigned any positional coordinate of zero or one as long as the positional coordinates maintain the integrity of the spatial relationship between the activations. The space between these four activations will be hereinafter referred to as the activation space. The fourth activation's 1141 positional coordinates (0,0) will be described hereinafter as the point of origin for the activation space. During bilinear interpolation, these activation values are weighted according to the following equation to generate a predicted value (Z) for the predicted activation 1151:

$$(Z) = (f(0,0)*(1-u)*(1-v)) + (f(1,0)*u*(1-v)) + (f(0,1)* (1-u)*v) + (f(1,1)*u*v);$$

wherein, in this illustrative example, f(0,0) is the value associated with the fourth activation 1141 at the positional coordinates (0,0), f(1,0) is the value associated with the second activation 1121 at the positional coordinates (1,0), f(0,1) is the value associated with the first activation 1111 at the positional coordinates (0,1), and f(1,1) is the value associated with the third activation 1131 at the positional coordinates (1,1), u is the distance between the point of origin (0,0) and the vector start point (E) in the x direction within the activation space, and v is the distance between the point of origin (0,0) and the vector start point (E) in the y direction within the activation space. Thus, in the example of FIG. 11C, the value for the predicted activation 1151 is:

$$(Z) = (0*(1-0.4)*(1-0.6)) + (10*0.4*(1-0.6)) + (5*(1-0.4)*0.6) + (8*0.4*0.6) = 5.32$$

Although the bilinear interpolator 1250 is configured to perform bilinear interpolation in this implementation, other interpolation techniques known in the art may be used, such as nearest neighbor interpolation or linear interpolation. The predicted neural network outputs are then sent to the neural network suffix 232 for CNN computations.

Figure 13A:
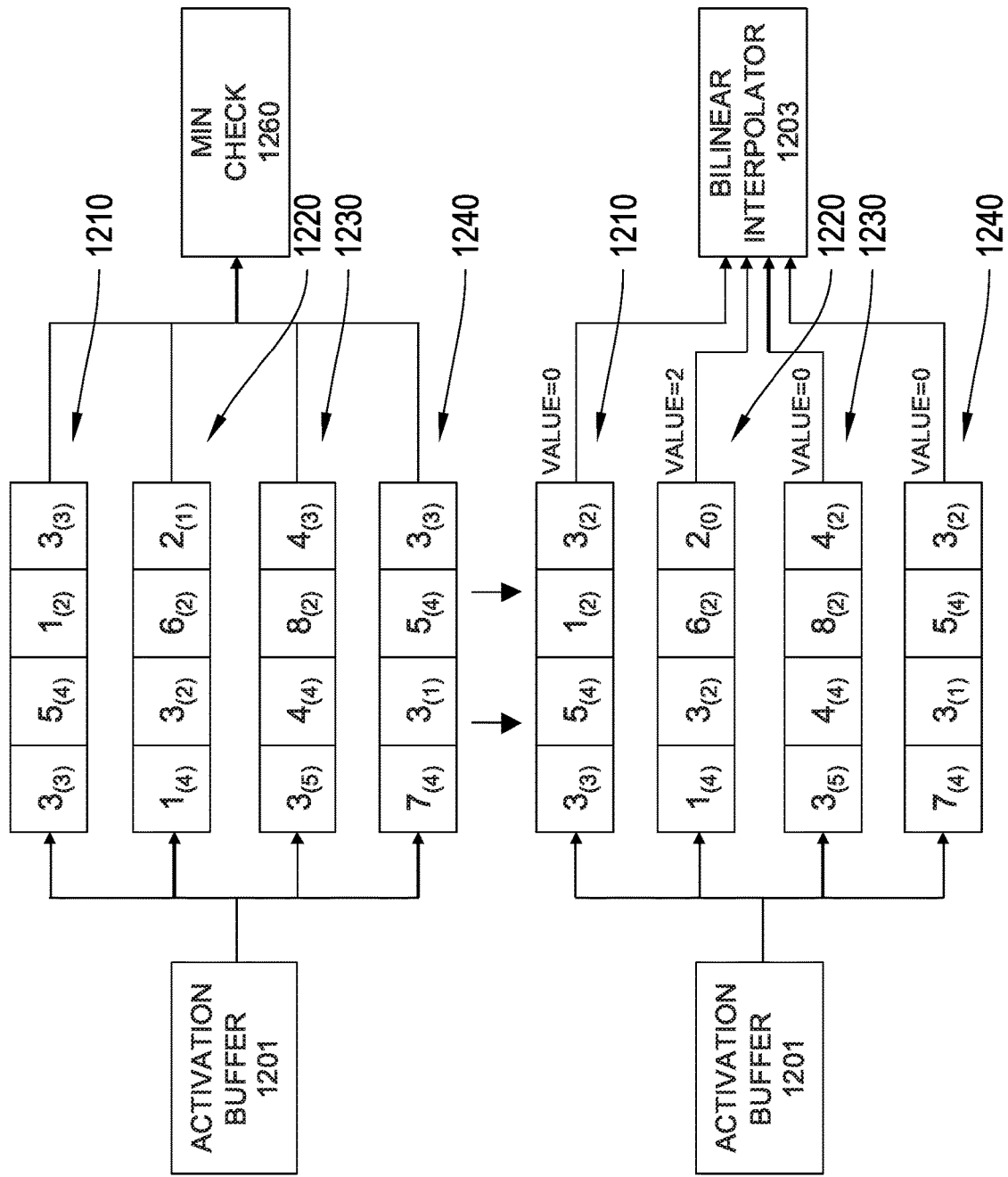
FIGS. 13A-13B are flow diagrams depicting a first shift and a second shift of on-the-fly skip-zero decoding as performed by logic for calculating predicted neural network outputs according to exemplary implementations of the present disclosure.
Figure 13B:
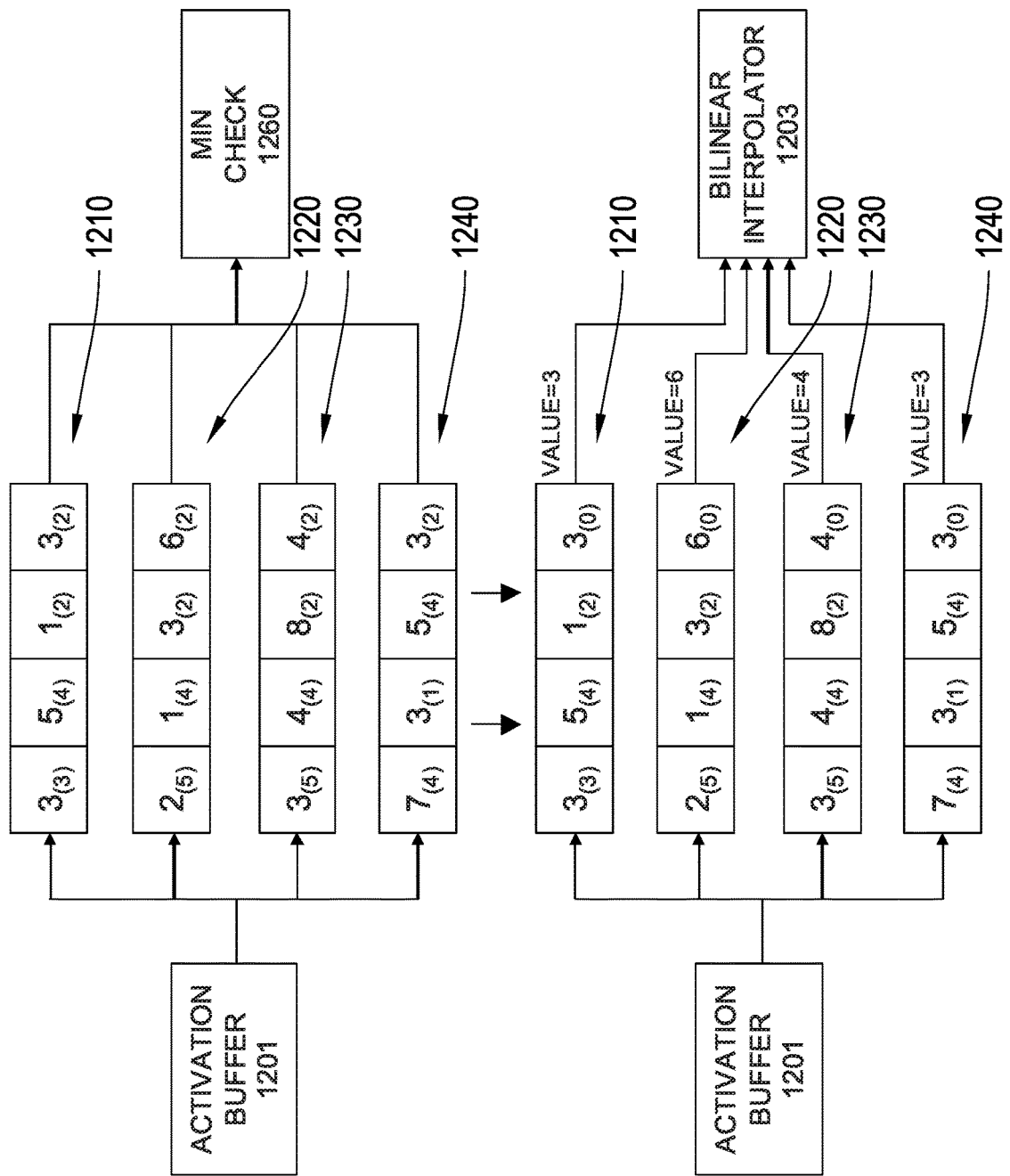

FIGS. 13A-13B show flow diagrams depicting a first shift and a second shift of an on-the-fly skip-zero decoding process performed by the logic for calculating predicted neural network outputs 1200 according to exemplary implementations of the present disclosure. The activation buffer 1201 receives the first plurality of neural network outputs. The decoder lanes are configured to receive a first plurality of activations from the activation buffer 1201. As described in the discussion regarding FIG. 12, when the prior location is identified for each receptive field in the subsequent input frame, the decoder lanes receive the activations corresponding to the channels of the multiple receptive fields proximate to the prior location. Also, as earlier described in FIG. 12, the neural network outputs have been zero-gap run length encoded.

Once the activations are received by the decoder lanes, the min check logic 1260 analyzes the zero-gaps in each decoder lane to identify a minimum zero gap amongst the zero gaps at the heads of the decoder lanes. The zero-gaps are represented as $N_{(i)}$ in this illustrative example, where N represents a non-zero activation and $_{(i)}$ represents its zero-gap. The min check logic 1260 sends the identified minimum zero-gap value, which is defined as the lowest zero-gap value, to every decoder lane. In this illustrative example, the minimum zero gap is 1. Each decoder lane then decrements its stored zero-gap by the minimum zero-gap value, thereby advancing every decoder lane at once in the channel space. By performing these skips, the interpolation processing unit 223 need not compute predicted activations for certain receptive field channels by performing interpolation. For example, referring to the bottom of FIG. 13A the interpolation processing unit 223 has skipped one zero in each decoder lane. Therefore, the interpolation processing unit 223 does not send the activation values for this channel, which may be associated with receptive fields in a first input frame proximate to the prior location in the first input frame of a new receptive field in the subsequent input frame, to the bilinear interpolator 1203. Instead, the interpolation processing unit 223 merely outputs predicted activation values of zero for this channel. After the skip, the decoder lanes containing neural network outputs with zero gap values of zero after the subtraction provide their activation output values as inputs to a bilinear interpolator 1203. The next zero-gap encoded neural network outputs are then advanced to the front of those decoder lanes. As shown in FIG. 13A, the decoder lanes with neural network outputs having positive zero-gap values provide zeros as their inputs to the bilinear interpolator 1203. Thus, the decoder lanes have provided the bilinear interpolator four activations that correspond to a channel of the receptive fields in the first input frame that are located proximate to the prior location in the first input frame of a receptive field in the subsequent input frame. After the bilinear interpolator outputs a value based on the values received from the decoder lanes, the min check logic 1260 then repeats the processes with the next neural network outputs as shown in FIG. 13B. In FIG. 13B, the second decoder lane 1220 has now moved a non-zero activation value and its assigned zero gap to the front of the decoder lane. As discussed earlier, the bilinear interpolator 1203 performs bilinear interpolation on the values as they are forwarded from the decoder lanes by scaling the vector to the dimensions of the neural network outputs and applying the scaled vector to interpolate between the neural network outputs to obtain a predicted activation for a channel of the receptive field in the subsequent input frame.

While discussed herein as being used in the interpolation processing unit 233 of the AI system 200, the logic for calculating predicted neural networks outputs 1200 can be used for other applications where bilinear interpolation is desired on sparse data that is zero-gap encoded, without the need to store the data in decoded form before processing.

Implementations of the subject matter and the operations described in this specification can be implemented in digital electronic circuitry, or in computer software embodied on a tangible medium, firmware, or hardware, including the structures disclosed in this specification and their structural equivalents, or in combinations of one or more of them. Implementations of the subject matter described in this specification can be implemented as one or more computer programs embodied on a tangible medium, i.e., one or more modules of computer program instructions, encoded on one or more computer storage media for execution by, or to control the operation of, a data processing apparatus. A computer storage medium can be, or be included in, a computer-readable storage device, a computer-readable storage substrate, a random or serial access memory array or device, or a combination of one or more of them. The computer storage medium can also be, or be included in, one or more separate components or media (e.g., multiple CDs, disks, or other storage devices). The computer storage medium may be tangible and non-transitory.

A computer program (also known as a program, software, software application, script, or code) can be written in any form of programming language, including compiled languages, interpreted languages, declarative languages, and procedural languages, and the computer program can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, libraries, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., a field programmable gate array ("FPGA") or an application specific integrated circuit ("ASIC"). Such a special purpose circuit may be referred to as a computer processor even if it is not a general-purpose processor.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be used.

The invention claimed is:

1. A method for processing spatial data comprising:
configuring at least one processor to implement at least one neural network comprising at least a first neural network portion and a second neural network portion different than the first neural network portion;
processing a first spatial data set in the first neural network portion of the neural network to generate a first plurality of neural network outputs for the first spatial data set;
generating a plurality of predicted neural network outputs of the first neural network portion for a second spatial data set different than the first spatial data set, based at least in part on motion estimation performed in the at least one processor between at least portions of the first and second spatial data sets, the plurality of predicted neural network outputs being generated utilizing at least a portion of the first plurality of neural network outputs generated by the first neural network portion for the first spatial data set; and
processing in the second neural network portion at least respective subsets of both (i) the first plurality of neural network outputs generated by the first neural network portion for the first spatial data set and (ii) the plurality of predicted neural network outputs of the first neural network portion generated for the second spatial data set;
wherein the processing of the first spatial data set in the first neural network portion and the generating of the plurality of predicted neural network outputs further comprise:
receiving the first spatial data set and dividing the first spatial data set into a first plurality of receptive fields;
processing, by the first neural network portion, the first plurality of receptive fields to obtain the first plurality of neural network outputs, wherein each neural network output corresponds to a receptive field in the first plurality of receptive fields;
storing, in memory, the first plurality of neural network outputs;
receiving the second spatial data set and dividing the second spatial data set into a second plurality of receptive fields;
identifying, in the at least one processor, for each receptive field in the second plurality of receptive fields a prior location in the first spatial data set, wherein the prior location is between multiple receptive field locations in the first plurality of receptive fields;
obtaining, from memory, the neural network outputs corresponding to the receptive fields of the first plurality of receptive fields proximate to the identified prior location for each receptive field in the second plurality of receptive fields; and
calculating, in the at least one processor, the plurality of predicted neural network outputs for the second plurality of receptive fields by, for a given receptive field in the second plurality of receptive fields, interpolating between the neural network outputs corresponding to the receptive fields proximate to the prior location of the given receptive field in the first spatial data set;

wherein the method further comprises:

performing at least one computer vision task based at least in part on results of the processing, in the second neural network portion, of the at least respective subsets of both the first plurality of neural network outputs and the plurality of predicted neural network outputs.

2. The method of claim 1, wherein storing the first plurality of neural network outputs includes run-length encoding the first plurality of neural network outputs.

3. The method of claim 2, wherein calculating the plurality of predicted neural network outputs further includes performing on-the-fly skip-zero decoding.

4. The method of claim 3, wherein performing on-the-fly skip-zero decoding for a given receptive field in the second spatial data set further includes storing the neural network outputs obtained from memory for the receptive fields proximate the identified prior location of the given receptive field in the second spatial data set in a plurality of decoding lanes, wherein each decoding lane stores zero-gap run-length encoded neural network outputs for a plurality of channels associated with a different receptive field of the first spatial data set located proximate to the identified prior location of the given receptive field of the second spatial data set.

5. The method of claim 1, wherein interpolating between the neural network outputs includes performing bilinear interpolation.

6. The method of claim 1, wherein at least one of the first neural network portion and the second neural network portion comprises a convolutional neural network portion.

7. The method of claim 1, wherein the first spatial data set and the second spatial data set each comprise at least one video frame from a continuous stream of video frames.

8. The method of claim 7, wherein the at least one video frame of the second spatial data set is subsequent relative to the at least one video frame of the first spatial data set.

9. The method of claim 1, wherein at least parts of the first spatial data set and the second spatial data set are processed by at least one of an artificial intelligence (AI) processor and an AI accelerator of the at least one processor.

10. The method of claim 9, wherein the at least one processor comprises an application-specific integrated circuit (ASIC).

11. The method of claim 9, wherein the at least one processor comprises a field programmable gate array (FPGA).

12. The method of claim 1, wherein the at least one processor comprises at least one of: a graphics processing unit or a vector processing unit.

13. A system for processing spatial data comprising:

a memory configured to receive and store a first spatial data set and a second spatial data set different than the first spatial data set, and at least one processor coupled to the memory, the at least one processor being configured to:

implement at least one neural network comprising at least a first neural network portion and a second neural network portion different than the first neural network portion;

process the first spatial data set in the first neural network portion of the neural network to generate a first plurality of neural network outputs for the first spatial data set;

generate a plurality of predicted neural network outputs of the first neural network portion for the second spatial data set different than the first spatial data set, based at least in part on motion estimation performed in the at least one processor between at least portions of the first and second spatial data sets, the plurality of predicted neural network outputs being generated utilizing at least a portion of the first plurality of neural network outputs generated by the first neural network portion for the first spatial data set; and process in the second neural network portion at least respective subsets of both (i) the first plurality of neural network outputs generated by the first neural network portion for the first spatial data set and (ii) the plurality of predicted neural network outputs of the first neural network portion generated for the second spatial data set;

wherein the at least one processor, in the processing of the first spatial data set in the first neural network portion and the generating of the plurality of predicted neural network outputs, is further configured to:

divide the first spatial data set into a first plurality of receptive fields and divide the second spatial data set into a second plurality of receptive fields;

process the first plurality of receptive fields in the first neural network portion to obtain the first plurality of neural network outputs, wherein each neural network output corresponds to a receptive field in the first plurality of receptive fields;

store each neural network output in the memory;

identify, for each receptive field in the second plurality of receptive fields, a prior location in the first spatial data set, wherein the prior location is between multiple receptive field locations in the first spatial data set;

receive, from the memory, the neural network outputs corresponding to the receptive fields of the first spatial data set proximate to the identified prior location for each receptive field in the second plurality of receptive fields; and calculate the plurality of predicted neural network outputs for the second plurality of receptive fields by interpolating between the neural network outputs corresponding to the receptive fields proximate to the prior locations in the first spatial data set;

wherein the at least one processor is further configured to:

perform at least one computer vision task based at least in part on results of the processing, in the second neural network portion, of the at least respective subsets of both the first plurality of neural network outputs and the plurality of predicted neural network outputs.

14. The system of claim 13, wherein the at least one processor includes an artificial intelligence (AI) accelerator configured to perform zero-gap run-length encoding on the first plurality of neural network outputs and store the zero-gap run-length encoded first plurality of neural network outputs in the memory.

15. The system of claim 14, wherein the at least one processor includes an interpolation processing unit configured to calculate the plurality of predicted neural network outputs, wherein calculating the plurality of predicted neural network outputs includes performing on-the-fly skip-zero decoding on the zero-gap run-length encoded first plurality of neural network outputs.

16. The system of claim 15, wherein the interpolation processing unit is further configured to perform on-the-fly skip-zero decoding for a given receptive field in the second spatial data set by storing the neural network outputs obtained from the memory for the receptive fields proximate the identified prior location of the given receptive field in a plurality of decoding lanes, wherein each decoding lane stores the zero-gap run-length encoded neural network outputs for a plurality of channels associated with a different receptive field of the first spatial data set located proximate the identified prior location of the given receptive field of the second spatial data set.

17. The system of claim 13, wherein interpolating between the neural network outputs includes configuring the at least one processor to perform bilinear interpolation.

18. The system of claim 13, wherein the at least one processor includes an artificial intelligence (AI) processor comprising the first neural network portion as a convolutional neural network portion, wherein the AI processor is configured to process the first plurality of receptive fields to obtain the first plurality of neural network outputs, wherein each neural network output corresponds to a receptive field in the first plurality of receptive fields.

19. The system of claim 13, wherein the memory comprises a buffer memory.

20. The system of claim 13, wherein the memory comprises at least one of content addressable memory, cache memory, and flash memory.

21. The system of claim 13, wherein generating predicted outputs of the first neural network portion for the second spatial data set further comprises bypassing processing of at least a part of the second spatial data set in the first neural network portion.

* * * * *